(12) United States Patent
Ohara et al.

(10) Patent No.: US 8,993,386 B2
(45) Date of Patent: Mar. 31, 2015

(54) METHOD FOR MANUFACTURING SEMICONDUCTOR DEVICE

(75) Inventors: Hiroki Ohara, Kanagawa (JP); Toshinari Sasaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 271 days.

(21) Appl. No.: 12/720,089

(22) Filed: Mar. 9, 2010

(65) Prior Publication Data

US 2010/0233847 A1   Sep. 16, 2010

(30) Foreign Application Priority Data

Mar. 12, 2009 (JP) ................................. 2009-058929
May 29, 2009 (JP) ................................. 2009-131059

(51) Int. Cl.
*H01L 21/84* (2006.01)
*C01G 51/00* (2006.01)
(Continued)

(52) U.S. Cl.
CPC ............ *C01G 15/006* (2013.01); *C01G 51/006* (2013.01); *H01L 29/7869* (2013.01);
(Continued)

(58) Field of Classification Search
CPC ....................... H01L 29/7869; H01L 29/28693
USPC ........... 257/E29.296, E21.414; 438/151, 149, 438/158, 104, 159, 162
See application file for complete search history.

(56) References Cited

U.S. PATENT DOCUMENTS 5,334,855 A    8/1994  Moyer et al.
5,466,617 A   11/1995  Shannon
(Continued)

FOREIGN PATENT DOCUMENTS

CN     1577027      2/2005
EP    1 033 755     9/2000
(Continued)

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
(Continued)

*Primary Examiner* — Kimberly Rizkallah
*Assistant Examiner* — Maria Ligai
(74) *Attorney, Agent, or Firm* — Eric J. Robinson; Robinson Intellectual Property Law Office, P.C.

(57) ABSTRACT

An object is to provide a semiconductor device including a semiconductor element which has favorable characteristics. A manufacturing method of the present invention includes the steps of: forming a first conductive layer which functions as a gate electrode over a substrate; forming a first insulating layer to cover the first conductive layer; forming a semiconductor layer over the first insulating layer so that part of the semiconductor layer overlaps with the first conductive layer; forming a second conductive layer to be electrically connected to the semiconductor layer; forming a second insulating layer to cover the semiconductor layer and the second conductive layer; forming a third conductive layer to be electrically connected to the second conductive layer; performing first heat treatment after forming the semiconductor layer and before forming the second insulating layer; and performing second heat treatment after forming the second insulating layer.

26 Claims, 23 Drawing Sheets

(51) Int. Cl.
*H01L 29/786* (2006.01)
*C01G 45/00* (2006.01)
*H01L 27/12* (2006.01)
*H01L 29/66* (2006.01)
*C01G 15/00* (2006.01)
*C01G 53/00* (2006.01)
*C01G 49/00* (2006.01)
*H01L 21/02* (2006.01)

(52) U.S. Cl.
CPC ........... *C01G45/006* (2013.01); *C01P 2002/52* (2013.01); *H01L 21/02631* (2013.01); *H01L 27/1225* (2013.01); *H01L 29/66742* (2013.01); *C01P 2006/40* (2013.01); *C01G 53/006* (2013.01); *H01L 21/02554* (2013.01); *H01L 21/02565* (2013.01); *C01G 49/009* (2013.01)
USPC .... 438/158; 438/159; 438/162; 257/E21.414; 257/E29.296

(56) References Cited

U.S. PATENT DOCUMENTS

| | | |
|---|---|---|
| 5,530,265 A | 6/1996 | Takemura |
| 5,696,011 A | 12/1997 | Yamazaki et al. |
| 5,701,167 A | 12/1997 | Yamazaki |
| 5,731,856 A | 3/1998 | Kim et al. |
| 5,744,864 A | 4/1998 | Cillessen et al. |
| 5,817,548 A | 10/1998 | Noguchi et al. |
| 5,840,600 A | 11/1998 | Yamazaki et al. |
| 5,847,410 A | 12/1998 | Nakajima |
| 5,952,708 A | 9/1999 | Yamazaki |
| 6,294,274 B1 | 9/2001 | Kawazoe et al. |
| 6,387,737 B1 | 5/2002 | Yamazaki et al. |
| 6,489,649 B2 | 12/2002 | Kobayashi et al. |
| 6,532,045 B2 | 3/2003 | Chung et al. |
| 6,563,174 B2 | 5/2003 | Kawasaki et al. |
| 6,586,346 B1 | 7/2003 | Yamazaki et al. |
| 6,596,585 B2 | 7/2003 | Kobayashi et al. |
| 6,674,136 B1 | 1/2004 | Ohtani |
| 6,680,242 B2 | 1/2004 | Ohtsu et al. |
| 6,713,785 B2 | 3/2004 | Yagi |
| 6,727,522 B1 | 4/2004 | Kawasaki et al. |
| 6,764,902 B2 | 7/2004 | Kobayashi et al. |
| 6,852,998 B2 | 2/2005 | Sung et al. |
| 6,885,146 B2 | 4/2005 | Yamazaki et al. |
| 6,900,461 B2 | 5/2005 | Inoue et al. |
| 6,960,812 B2 | 11/2005 | Yamazaki et al. |
| 7,009,204 B2 | 3/2006 | Tsai et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,075,139 B2 | 7/2006 | Kobayashi et al. |
| 7,075,614 B2 | 7/2006 | Izumi et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,086 B2 | 10/2008 | Yamazaki et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,542,024 B2 | 6/2009 | Koyama |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,875,559 B2 | 1/2011 | Park et al. |
| 7,935,582 B2 | 5/2011 | Iwasaki |
| 7,956,361 B2 | 6/2011 | Iwasaki |
| 7,993,964 B2 | 8/2011 | Hirao et al. |
| 8,143,678 B2 | 3/2012 | Kim et al. |
| 8,148,722 B2 | 4/2012 | Park et al. |
| 8,154,024 B2 | 4/2012 | Iwasaki |
| 8,304,765 B2 | 11/2012 | Yamazaki et al. |
| 8,558,323 B2 | 10/2013 | Kim et al. |
| 2001/0040252 A1 | 11/2001 | Kobayashi et al. |
| 2001/0046027 A1 | 11/2001 | Tai et al. |
| 2002/0056838 A1 | 5/2002 | Ogawa |
| 2002/0109796 A1 | 8/2002 | Lin et al. |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0132293 A1 | 7/2004 | Takayama et al. |
| 2005/0017302 A1 | 1/2005 | Hoffman |
| 2005/0147739 A1* | 7/2005 | Yamazaki et al. ............. 427/66 |
| 2005/0199959 A1 | 9/2005 | Chiang et al. |
| 2005/0259206 A1 | 11/2005 | Son |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0086933 A1 | 4/2006 | Iechi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163743 A1 | 7/2006 | Kuwabara et al. |
| 2006/0169973 A1 | 8/2006 | Isa et al. |
| 2006/0170067 A1 | 8/2006 | Maekawa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1* | 11/2006 | Sugihara et al. ............. 257/646 |
| 2006/0284171 A1 | 12/2006 | Levy et al. |
| 2006/0284172 A1 | 12/2006 | Ishii |
| 2006/0286737 A1 | 12/2006 | Levy et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. ............. 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0158652 A1 | 7/2007 | Lee et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0166860 A1* | 7/2008 | Yamazaki et al. ............. 438/479 |
| 2008/0182358 A1 | 7/2008 | Cowdery-Corvan et al. |
| 2008/0198108 A1 | 8/2008 | Aoki |

(56) References Cited

U.S. PATENT DOCUMENTS

| | | |
|---|---|---|
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1* | 2/2009 | Iwasaki .......................... 257/43 |
| 2009/0050884 A1 | 2/2009 | Ye |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114911 A1 | 5/2009 | Maekawa et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153762 A1 | 6/2009 | Kuwabara et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0269880 A1* | 10/2009 | Itagaki et al. .................. 438/104 |
| 2009/0278122 A1 | 11/2009 | Hosono et al. |
| 2009/0280600 A1 | 11/2009 | Hosono et al. |
| 2010/0001274 A1* | 1/2010 | Ye .................................. 257/57 |
| 2010/0025676 A1 | 2/2010 | Yamazaki et al. |
| 2010/0025677 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0032665 A1 | 2/2010 | Yamazaki et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1* | 4/2010 | Watanabe ....................... 257/43 |
| 2010/0092800 A1 | 4/2010 | Itagaki et al. |
| 2010/0109002 A1 | 5/2010 | Itagaki et al. |
| 2010/0233848 A1 | 9/2010 | Ohara et al. |
| 2011/0003430 A1 | 1/2011 | Yamazaki et al. |
| 2011/0133183 A1 | 6/2011 | Yamazaki et al. |
| 2011/0278567 A1 | 11/2011 | Ye |

FOREIGN PATENT DOCUMENTS

| | | |
|---|---|---|
| EP | 1 134 811 | 9/2001 |
| EP | 1 396 881 | 3/2004 |
| EP | 1737044 | 12/2006 |
| EP | 2226847 | 9/2010 |
| EP | 2339639 A | 6/2011 |
| JP | 59-181573 A | 10/1984 |
| JP | 60-170972 | 9/1985 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 02-226729 | 9/1990 |
| JP | 03-231472 A | 10/1991 |
| JP | 04-049674 A | 2/1992 |
| JP | 04-302435 | 10/1992 |
| JP | 05-251705 | 9/1993 |
| JP | 06-088972 | 3/1994 |
| JP | 08-125197 | 5/1996 |
| JP | 08-264794 | 10/1996 |
| JP | 10-242310 | 9/1998 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086000 A | 3/2003 |
| JP | 2003-086808 A | 3/2003 |
| JP | 2003-179233 A | 6/2003 |
| JP | 2003-248240 | 9/2003 |
| JP | 2004-103957 | 4/2004 |
| JP | 2004-273614 | 9/2004 |
| JP | 2004-273732 | 9/2004 |
| JP | 2005-033172 | 2/2005 |
| JP | 2005-165300 A | 6/2005 |
| JP | 2006-128654 A | 5/2006 |
| JP | 2007-096055 | 4/2007 |
| JP | 2007-103918 A | 4/2007 |
| JP | 2007-123861 | 5/2007 |
| JP | 2007-194594 A | 8/2007 |
| JP | 2007-220817 | 8/2007 |
| JP | 2007-250983 A | 9/2007 |
| JP | 2007-529117 | 10/2007 |
| JP | 2007-299913 A | 11/2007 |
| JP | 2008-172243 A | 7/2008 |
| JP | 2008-199005 A | 8/2008 |
| JP | 2008-205451 | 9/2008 |
| JP | 2008-281988 | 11/2008 |
| JP | 2009-528670 | 8/2009 |
| WO | WO-2004/114391 | 12/2004 |
| WO | WO-2005/048353 | 5/2005 |
| WO | WO-2005/093847 | 10/2005 |
| WO | WO-2007/029844 | 3/2007 |
| WO | WO-2007/119386 | 10/2007 |
| WO | WO-2007/142167 | 12/2007 |
| WO | WO 2008/126879 | 10/2008 |
| WO | WO-2010/103935 | 9/2010 |

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Kamiya et al., "1a-F-5 Room temperature fabrication and carrier transport of amorphous semiconductor exhibiting large electron Hall mobilities > 10 $cm^2$/Vs," (The $65^{th}$ Autumn Meeting, 2004) The Japan Society of Applied Physics, Sep. 1, 2004, No. 2, p. 791.

Nomura et al., "31a-ZA-6 Carrier Transport in Transparent Amorphous Oxide Semiconductor $InGaZnO_4$," (The $51^{st}$ Spring Meeting, 2004); The Japan Society of Applied Physics and Related Societies, Mar. 28, 2004, No. 2, p. 669.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$—$ZnGa_2O_4$—ZnO System," Journal of Solid State Chemistry, Apr. 1, 1995, vol. 116, No. 1, pp. 170-178.

(56) References Cited

OTHER PUBLICATIONS

Nomura et al., "Thin-Film Transistor Fabricated in Single-Crystalline Transparent Oxide Semiconductor," Science, May 23, 2003, vol. 300, No. 5623, pp. 1269-1272.
Nomura et al., "Room-Temperature Fabrication of Transparent Flexible Thin-Film Transistors Using Amorphous Oxide Semiconductors," Nature, Nov. 25, 2004, vol. 432, pp. 488-492.
Nakamura et al., "Syntheses and crystal structures of new homologous compounds, indium iron zinc oxides (InFeO$_3$(ZnO)$m$) ($m$: natural number) and related compounds," Kotai Butsuri (Solid State Physics), 1993, vol. 28, No. 5, pp. 317-327.
Li et al., "Modulated Structures of Homologous Compounds InMO$_3$(ZnO)$m$ ($M$=In, Ga; $m$=Integer) Described by Four-Dimensional Superspace Group," Journal of Solid State Chemistry, 1998, vol. 139, pp. 347-355.
Specification, Claims, Abstract, Drawings of U.S. Appl. No. 12/720,092 to Hiroki Ohara et al.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using Cg-Silicon Technology,", SID Digest '04 : SID International Symposium Digest of Technical Papers, 2004, vol. 35, pp. 860-863.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, pp. 899-902.
Kanno.H et al., "White Stacked Electrophosphorecent Organic Light-Emitting Device Employing MoO$_3$ As a Change-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-277.
Park.S et al., "Challenge to Future Displays: Transparent AM-OLED Driven by PEALD Grown ZnO TFT,", IMID '07 Digest, 2007, p. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID , 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.
Lee.H et al., "Current Status of, Challenges to, and Perspective View of AM-OLED,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe$_2$O$_4$, and Yb$_2$Fe$_3$O$_7$ Types of Structures for Compounds in the In$_2$O$_3$ and Sc$_2$O$_3$—A$_2$O$_3$—BO Systems [A: Fe, Ga, or Al; B: Mg, Mn, Fe, Ni, Cu, or Zn] At Tempertures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

(56) References Cited

OTHER PUBLICATIONS

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Hosono.H et al., "Factors controlling electron transport properties in transparent amorphous oxide semiconductors,", Journal of Non-Crystalline Solid, 2008, vol. 354, pp. 2796-2800.

Fung T.-C. et al., "Bias Temperature Stress Study of RF Sputter Amorphous In—Ga—Zn—O TFTs,", IDW '08 : Proceedings of the 15th International Display Workshops, Dec. 3, 2008, pp. 1621-1624.

International Search Report (Application No. PCT/JP 2010-053015) dated Jun. 1, 2010.

Written Opinion (Application No. PCT/JP 2010-053015) dated Jun. 1, 2010.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO_4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3(ZnO)m$ (m<4):a Zn4s conductor,", Philosophical Magazine B, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett. (Applied Physics Letters, Sep. 1, 2003, vol. 83, No. 9, pp. 1755-1757.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

European Search Report (Application No. 10750689.1; PCTEP12227/12411) Dated Dec. 19, 2012.

Chinese Office Action (Application No. 201080011089.1; PCTCN12227/12411) Dated Jun. 6, 2013.

Specification, Claims, Abstract, Drawings of U.S. Appl. No. 12/720,092 to Hiroki Ohara et al, Mar. 9, 2010.

* cited by examiner

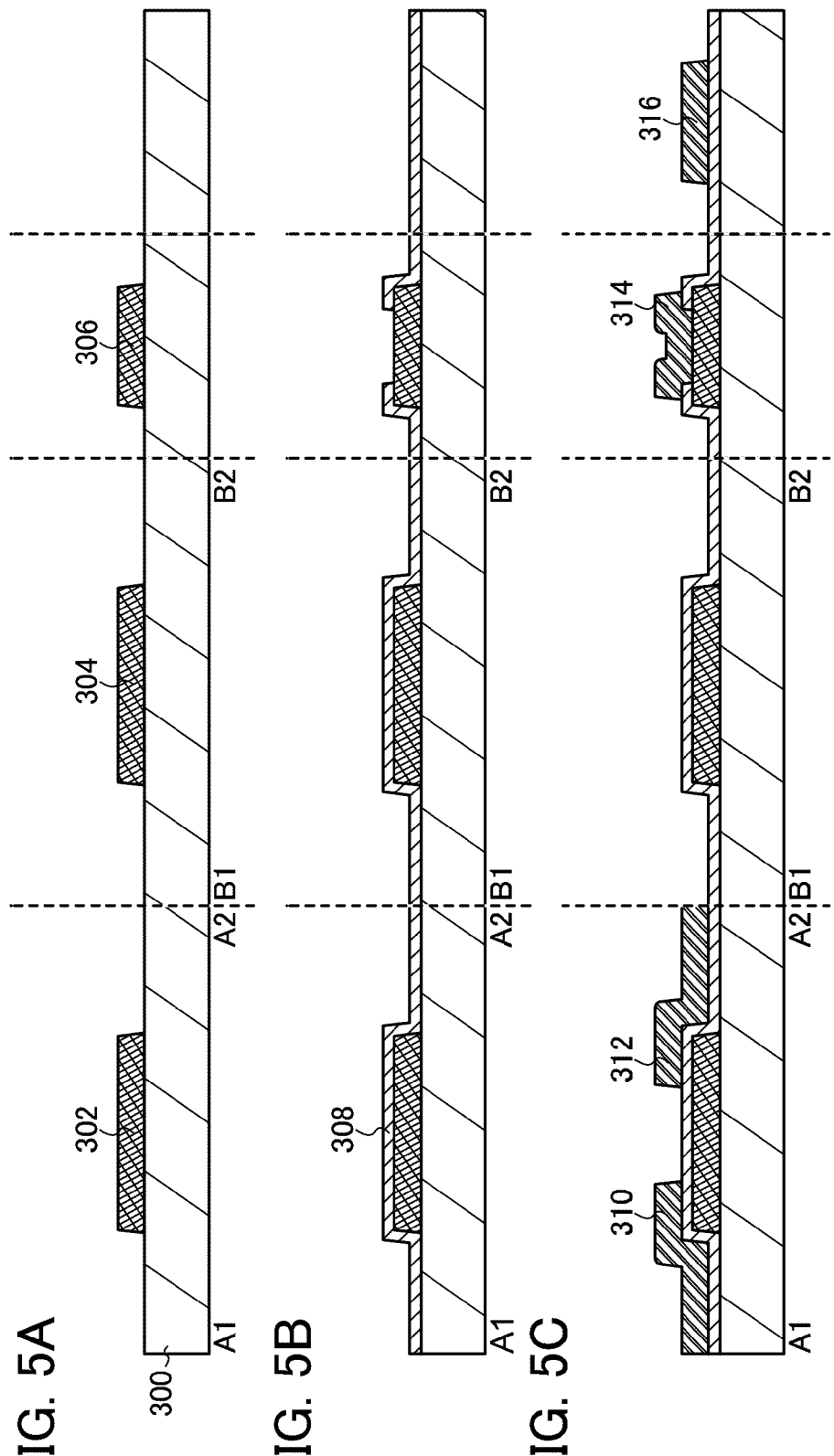

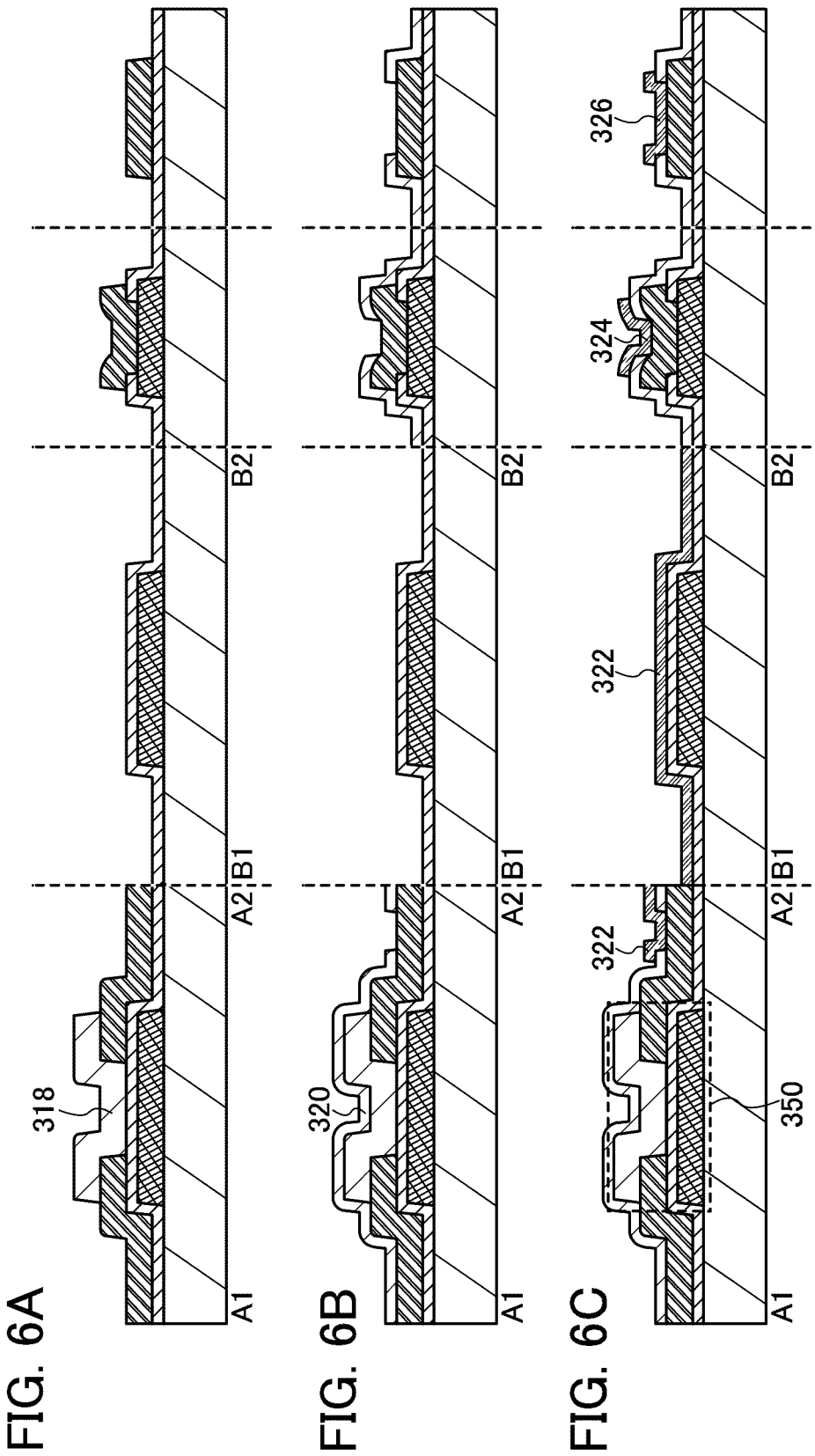

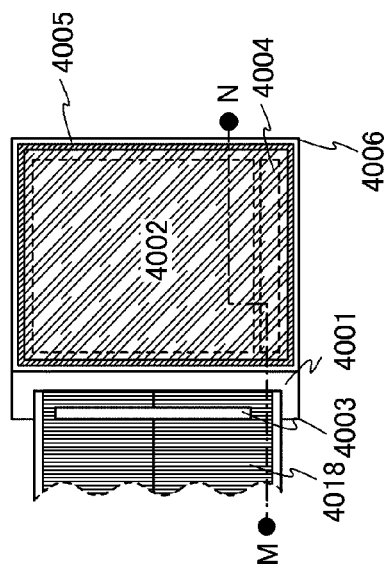
FIG. 8A1
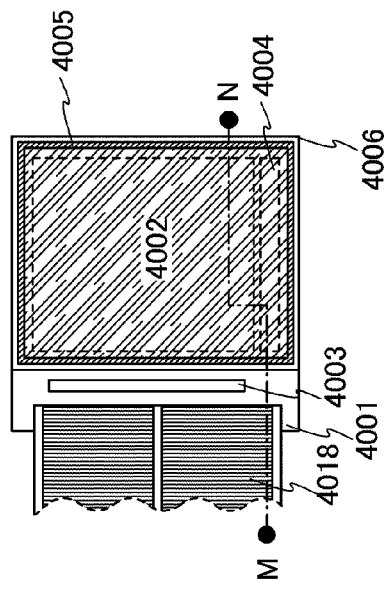
FIG. 8A2
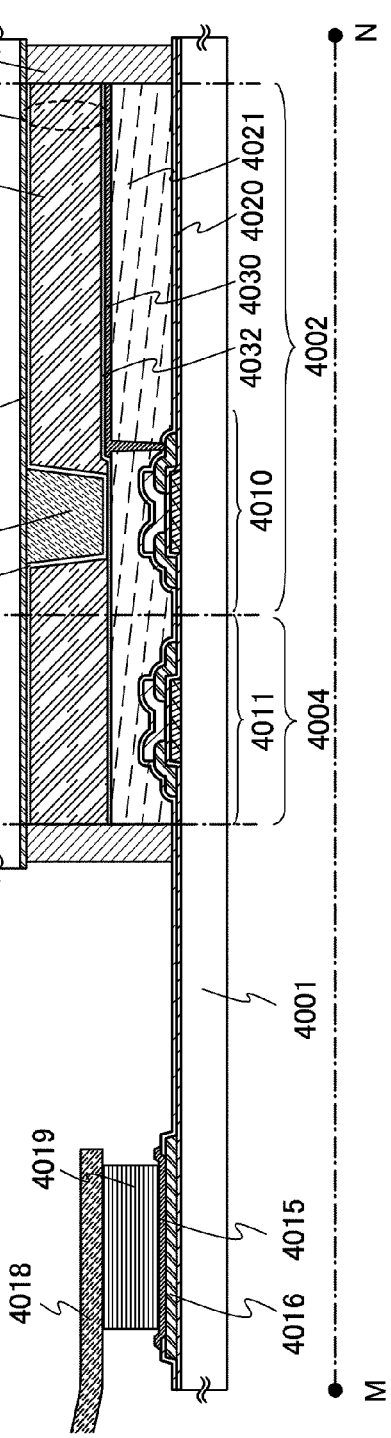
FIG. 8B

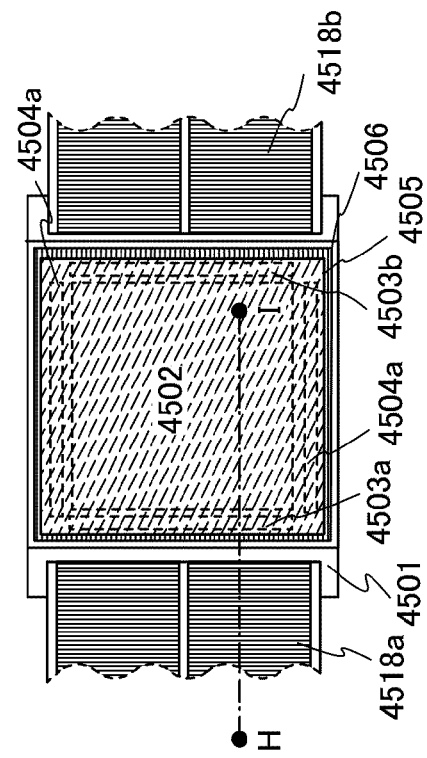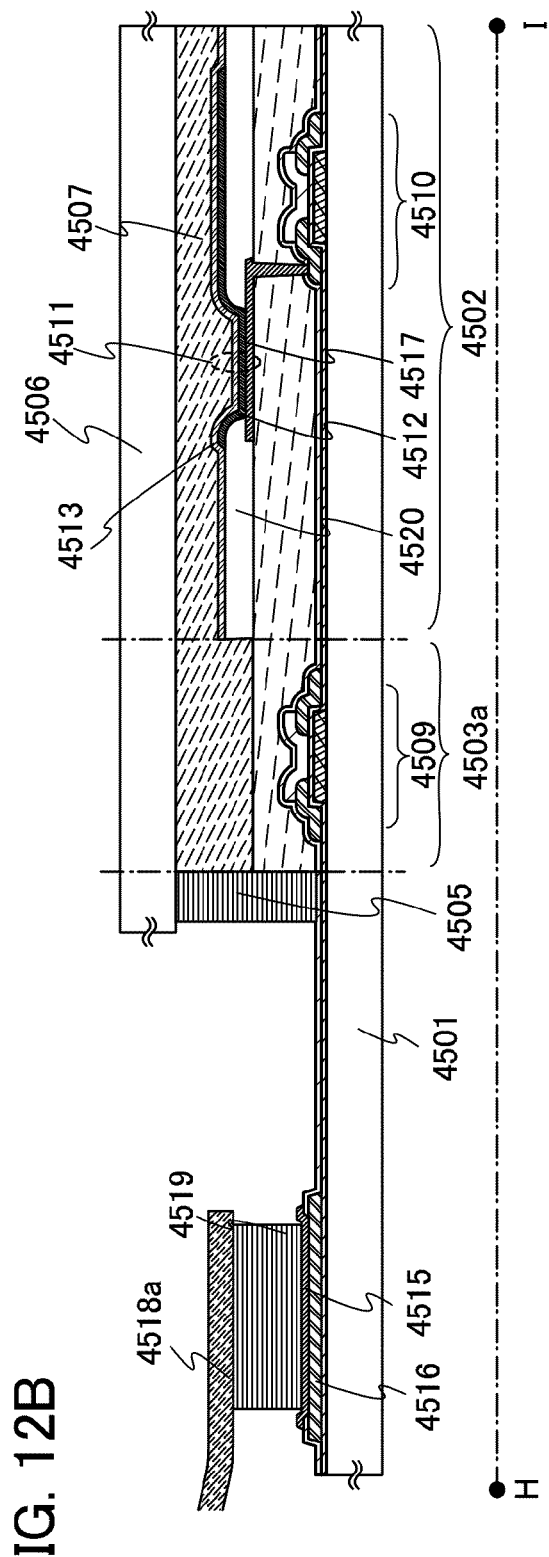
FIG. 12A
FIG. 12B

| film-formation conditions of insulating film | hydrogen concentration | | nitrogen concentration | |
|---|---|---|---|---|
| | semiconductor layer [atoms/cm$^3$] | insulating layer [atoms/cm$^3$] | semiconductor layer [atoms/cm$^3$] | insulating layer [atoms/cm$^3$] |
| Ar/O$_2$= 40(sccm)/10(sccm) | $8 \times 10^{20}$ | $3 \times 10^{20}$ | $1.5 \times 10^{19}$ | $7 \times 10^{17}$ |
| Ar/O$_2$= 25(sccm)/25(sccm) | $1 \times 10^{21}$ | $2.5 \times 10^{20}$ | $1 \times 10^{19}$ | $6 \times 10^{17}$ |

METHOD FOR MANUFACTURING SEMICONDUCTOR DEVICE

TECHNICAL FIELD

The technical field relates to a method for manufacturing a semiconductor device.

BACKGROUND ART

There are a wide variety of metal oxides and such material oxides are used for various applications. Indium oxide is a well-known material and is used as a transparent electrode material which is necessary for liquid crystal displays and the like.

Some metal oxides have semiconductor characteristics. The examples of such metal oxides having semiconductor characteristics are tungsten oxide, tin oxide, indium oxide, zinc oxide, and the like. A thin film transistor in which a channel formation region is formed using such metal oxides having semiconductor characteristics is known (for example, see Patent Documents 1 to 4, Non-Patent Document 1).

As metal oxides, multi-component oxides as well as single-component oxides are known. For example, homologous compound, $InGaO_3(ZnO)_m$ (m is natural number) is known as a multi-component oxide containing In, Ga and Zn (for example, see Non-Patent Documents 2 to 4 and the like).

Furthermore, it is confirmed that an oxide semiconductor including such an In—Ga—Zn-based oxide is applicable to a channel layer of a thin film transistor (for example, see Patent Document 5, Non-Patent Documents 5 and 6, and the like).

REFERENCE

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.,* 17 Jun. 1996, Vol. 68, pp. 3650-3652

[Non-Patent Document 2] M. Nakamura, N. Kimizuka, and T. Mohri, "The Phase Relations in the $In_2O_3$—$Ga_2ZnO_4$—ZnO System at 1350 ° C.", *J. Solid State Chem.,* 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.,* 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS),* 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE,* 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432, pp. 488-492

DISCLOSURE OF INVENTION

As seen from the above, an oxide semiconductor has been extensively researched; however, for its complex composition, the characteristics of the oxide semiconductor itself have not been elucidated. The present situation is that under these circumstances, a manufacturing condition by which a semiconductor element using an oxide semiconductor can have favorable characteristics has not been found.

In view of the foregoing problems, an object of an embodiment of the present invention disclosed in this specification and the like (including at least the specification, the claims, and the drawings) is to provide a semiconductor device including a semiconductor element which has favorable characteristics.

In one embodiment of the present invention disclosed in this specification and the like, a first heat treatment is performed after a step of forming a semiconductor layer and before a step of forming an insulating layer which covers the semiconductor layer and the like; and a second heat treatment is performed after the step of forming the insulating layer which covers the semiconductor layer and the like.

For example, one embodiment of the present invention which is disclosed in this specification is a manufacturing method of a semiconductor device including the steps of: forming a first conductive layer which functions as a gate electrode over a substrate; forming a first insulating layer to cover the first conductive layer; forming a semiconductor layer over the first insulating layer so that part of the semiconductor layer overlaps with the first conductive layer; forming a second conductive layer to be electrically connected to the semiconductor layer; forming a second insulating layer to cover the semiconductor layer and the second conductive layer; forming a third conductive layer to be electrically connected to the second conductive layer; performing a first heat treatment after the step of forming the semiconductor layer and before the step of forming the second insulating layer; and performing a second heat treatment after the step of forming the second insulating layer.

Note that an oxide semiconductor layer containing indium, gallium, and zinc is desirably formed as the above-described semiconductor layer. Further, it is desirable that a hydrogen concentration in the semiconductor layer be higher than a hydrogen concentration in the second insulating layer and a nitrogen concentration in the semiconductor layer be higher than a nitrogen concentration in the second insulating layer. The hydrogen concentration in the second insulating layer may be $1\times10^{21}$ atoms/cm$^3$ or lower (preferably, $5\times10^{20}$ atoms/cm$^3$ or lower) and the nitrogen concentration in the second insulating layer may be $1\times10^{19}$ atoms/cm$^3$ or lower.

In the above structure, there is no particular limitation on a positional relation, a formation order, or the like of the semiconductor layer and the second conductive layer. For example, the semiconductor layer and the second conductive layer can be formed so that the semiconductor layer and the second conductive layer are electrically connected at a surface of the semiconductor layer on the second insulating layer side. Alternatively, the semiconductor layer and the second conductive layer can be formed so that the semiconductor layer and the second conductive layer are electrically connected at a surface of the semiconductor layer on the first insulating layer side. Further alternatively, in the case where the second conductive layer has a stacked-layer structure, a structure may be employed in which the semiconductor layer is sandwiched between layers of the second conductive layer.

Note that in the above structure, the timing of the heat treatment and the other steps can be changed as appropriate unless a contradiction arises due to the change. For example, the first heat treatment may be performed after the step of forming the second conductive layer and before the step of forming the second insulating layer. Alternatively, the second heat treatment may be performed after the step of forming the third conductive layer.

In the above structure, it is desirable that a heat treatment temperature of the first heat treatment and a heat treatment temperature of the second heat treatment be 400° C. or lower.

Note that in this specification and the like, a semiconductor device means any device which can function by utilizing semiconductor characteristics; and a display device, a semiconductor circuit, and an electronic device are all included in the semiconductor devices.

In one embodiment of the disclosed invention, a first heat treatment is performed after a step of forming a semiconductor layer and before a step of forming an insulating layer which covers the semiconductor layer and the like; and a second heat treatment is performed after the step of forming the insulating layer which covers the semiconductor layer and the like. This makes it possible to provide a semiconductor device including a semiconductor element which has favorable characteristics.

The above-described effect is enhanced especially in such cases as the following: the case of using an oxide semiconductor layer containing indium, gallium, and zinc as the semiconductor layer; the case where a hydrogen concentration in the semiconductor layer is higher than a hydrogen concentration in the second insulating layer; the case where a nitrogen concentration in the semiconductor layer is higher than a nitrogen concentration in the second semiconductor layer; or the like.

As described above, a semiconductor device including a semiconductor element which has favorable characteristics can be provided by one embodiment of the disclosed invention.

BRIEF DESCRIPTION OF DRAWINGS

In the accompanying drawings:

FIGS. 5A to 5C are cross-sectional views illustrating a method for manufacturing a semiconductor device;

FIGS. 6A to 6C are cross-sectional views illustrating the method for manufacturing the semiconductor device;

FIGS. 8A1, 8A2 and 8B are drawings illustrating a semiconductor device;

FIGS. 12A and 12B are drawings illustrating a semiconductor device;

BEST MODE FOR CARRYING OUT THE INVENTION

Figure 1A:
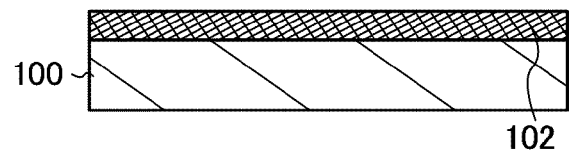
FIGS. 1A to 1E are cross-sectional views illustrating a method for manufacturing a semiconductor element included in a semiconductor device.

Hereinafter, embodiments will be described in detail using the drawings. Note that the present invention is not limited to the description of the following embodiments, and it is apparent to those skilled in the art that modes and details can be modified in various ways without departing from the spirit of the present invention disclosed in this specification and the like. Structures of different embodiments can be implemented in an appropriate combination. In the description of the invention with reference to the drawings, a reference numeral indicating the same part is used in common throughout different drawings, and the repeated description is omitted. In addition, the semiconductor device in this specification indicates all devices that operate by utilizing semiconductor characteristics.

Embodiment 1

In this embodiment, an example of a method for manufacturing a semiconductor element which is used for a semiconductor device is described with reference to drawings.

First, a conductive layer 102 is formed over a substrate 100 (see FIG. 1A).

Any substrate can be used for the substrate 100 as long as it is a substrate having an insulating surface, for example, a glass substrate. It is preferable that the glass substrate be a non-alkali glass substrate. As a material of the non-alkali glass substrate, a glass material such as aluminosilicate glass, aluminoborosilicate glass, barium borosilicate glass, or the like is used, for example. Besides, as the substrate 100, an insulating substrate formed of an insulator such as a ceramic substrate, a quartz substrate, or a sapphire substrate, a semiconductor substrate formed of a semiconductor material such as silicon, over which an insulating material is covered, a conductive substrate formed of a conductive material such as metal or stainless steel, over which an insulating material is covered can be used. A plastic substrate can also be used as long as it can withstand heat treatment in a manufacturing step.

The conductive layer 102 is preferably formed of a conductive material such as aluminum (Al), copper (Cu), molybdenum (Mo), tungsten (W), or titanium (Ti). As a formation method, a sputtering method, a vacuum evaporation method, a CVD method, and the like are given. In the case of using aluminum (or copper) for the conductive layer 102, since aluminum itself (or copper itself) has disadvantages such as low heat resistance and a tendency to be corroded, it is preferably formed in combination with a conductive material having heat resistance.

As the conductive material having heat resistance, it is possible to use metal containing an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of these elements as its component, or the like. The conductive layer 102 may be formed by stacking the conductive material having heat resistance and aluminum (or copper).

Although not shown in the drawings, the substrate 100 may be provided with a base layer. The base layer has a function of preventing diffusion of an impurity from the substrate 100, such as an alkali metal (Li, Cs, Na, or the like), an alkaline earth metal (Ca, Mg, or the like), or the like. In other words, provision of the base layer can realize improvement in the reliability of the semiconductor device. The base layer may be formed to have a single-layer structure or a stacked-layer structure using a variety of insulating materials such as silicon nitride or silicon oxide. Specifically, for example, a structure in which silicon nitride and silicon oxide are stacked in that order over the substrate 100 is favorable. This is because silicon nitride has a high blocking effect against an impurity. At the same time, in the case where silicon nitride is in contact with a semiconductor, there is a possibility that a problem occurs in the semiconductor element; thus, silicon oxide is preferably applied as a material to be in contact with the semiconductor.

Figure 1B:
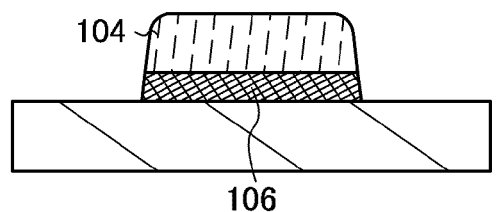

Next, a resist mask 104 is selectively formed over the conductive layer 102 and the conductive layer 102 is selectively etched using the resist mask 104, whereby a conductive layer 106 which functions as a gate electrode is formed (see FIG. 1B).

The resist mask 104 is formed through steps such as application of a resist material, light exposure using a photomask, and development. For the application of the resist material, a method such as a spin-coating method can be employed. Instead, the resist mask 104 may be selectively formed by a droplet discharging method, a screen printing method, or the like. In this case, the steps of light disposure using a photomask, development, and the like are not needed; therefore, improvement in productivity can be achieved. Note that the resist mask 104 is removed after the conductive layer 106 is formed by etching the conductive layer 102.

The resist mask 104 may be formed using a multi-tone mask. Here, the multi-tone mask is a mask capable of light exposure with multi-level light intensity. With the use of a multi-tone mask, one-time exposure and development process allow a resist mask with plural thicknesses (typically, two kinds of thicknesses) to be formed. By use of the multi-tone mask, the number of steps can be suppressed.

As the above etching treatment, dry etching may be used, or wet etching may be used. In order to improve coverage of a gate insulating layer or the like which is formed later and prevent disconnection, the etching is preferably performed so that end portions of the conductive layer 106 are tapered. For example, the end portions are preferably tapered at a taper angle 20° or more and less than 90°. Here, the "taper angle" refers to an angle formed by a side surface of a layer which is tapered to a bottom surface thereof when the layer having a tapered shape is observed from a cross-sectional direction.

Figure 1C:
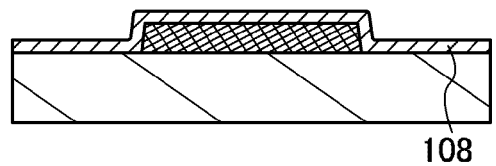

Next, an insulating layer 108 which functions as a gate insulating layer is formed so as to cover the conductive layer 106 (see FIG. 1C). The insulating layer 108 can be formed using a material such as silicon oxide, silicon oxynitride, silicon nitride, silicon nitride oxide, aluminum oxide, or tantalum oxide. The insulating layer 108 may also be formed by stacking films formed of these materials. These films are preferably formed to a thickness of 5 nm or more and 250 nm or less by a sputtering method or the like. For example, as the insulating layer 108, a silicon oxide film can be formed to a thickness of 100 nm by a sputtering method. While the method for forming the insulating layer 108 is not particularly limited as long as the predetermined insulating layer 108 can be obtained, the effect of hydrogen, nitrogen, or the like in the film needs to be taken into consideration in the case where the insulating layer 108 is formed using another method (such as a CVD method). For example, the insulating layer 108 is formed so that the hydrogen concentration and nitrogen concentration therein are lower than those in a semiconductor layer to be formed later. More specifically, it is preferable that the hydrogen concentration in the insulating layer 108 be $1\times10^{21}$ atoms/cm$^3$ or lower (more preferably $5\times10^{20}$ atoms/cm$^3$ or lower); the nitrogen concentration in the insulating layer 108 be $1\times10^{19}$ atoms/cm$^3$ or lower. Note that in order to obtain the insulating layer 108 which has favorable characteristics, the temperature of the film formation is preferably 400° C. or lower; however, one embodiment of the disclosed invention is not limited to this. Further, the concentrations which are described above show the average values in the insulating layer 108.

Alternatively, the insulating layer 108 with a stacked-layer structure may be formed by combination of a sputtering method and a CVD method (a plasma CVD method or the like). For example, a lower layer of the insulating layer 108 (a region in contact with the conductive layer 106) is formed by a plasma CVD method and an upper layer of the insulating layer 108 can be formed by a sputtering method. Since a film with favorable step coverage is easily formed by a plasma CVD method, it is suitable for a method for forming a film just above the conductive layer 106. In the case of using a sputtering method, since it is easy to reduce hydrogen concentration in the film as compared with the case of using a plasma CVD method, by providing a film by a sputtering method in a region in contact with a semiconductor layer, the hydrogen in the insulating layer 108 can be prevented from being diffused into the semiconductor layer. Specifically, in the case where a semiconductor layer is formed using an oxide semiconductor material, since it is considered that hydrogen has a great influence on characteristics, it is effective to employ such a structure.

Note that in this specification and the like, an oxynitride refers to a substance that contains more oxygen (atoms) than nitrogen (atoms). For example, a silicon oxynitride is a substance including oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, nitride oxide refers to a substance that contains more nitrogen (atoms) than oxygen (atoms). For example, a silicon nitride oxide is a substance including oxygen, nitrogen, silicon, and hydrogen in ranges of 5 at. % to 30 at. %, 20 at. % to 55 at. %, 25 at. % to 35 at. %, and 10 at. % to 25 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total of the content rate of the constituent elements does not exceed 100 at. %.

Figure 1D:
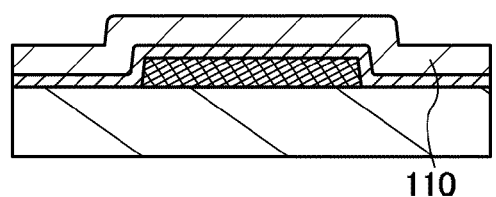

Next, a semiconductor layer 110 is formed so as to cover the insulating layer 108 (see FIG. 1D). In this embodiment, the semiconductor layer 110 includes an oxide semiconductor material (a metal oxide semiconductor material). Note that one embodiment of the disclosed invention can be applied to a case of using other semiconductor materials. The semiconductor layer 110 may be formed using, for example, a silicon-based semiconductor material such as single crystal silicon, polycrystalline silicon or amorphous silicon, a germanium-based semiconductor material, or the like. Alternatively, a compound semiconductor material such as silicon germanium, silicon carbide, gallium arsenide, or indium phosphide may be used.

Note that as an example of the above oxide semiconductor material, one represented by $InMO_3(ZnO)_m$ (m>0) is given. Here, M denotes one or more of metal elements selected from gallium (Ga), iron (Fe), nickel (Ni), manganese (Mn), and cobalt (Co) and the like. For example, the case where Ga is selected as M includes the case where the aforementioned metal element other than Ga is selected such as a combination of Ga and Ni, or a combination of Ga and Fe as well as the case where only Ga is used. Moreover, in the above oxide semiconductor, in some cases, a transition metal element such as Fe or Ni or an oxide of the transition metal is contained as an impurity element in addition to a metal element contained as M. Needless to say, the oxide semiconductor material is not limited to the above materials and a variety of oxide semiconductor materials such as zinc oxide or indium oxide can be used.

In the case where the semiconductor layer 110 is formed using an In—Ga—Zn-based material as an oxide semiconductor material, for example, a sputtering method using an oxide semiconductor target containing In, Ga, and Zn ($In_2O_3$: $Ga_2O_3$:ZnO=1:1:1) can be employed. The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide. As the above sputtering method, an RF sputtering method using a high frequency power supply for a power supply for sputtering, a DC sputtering method using a DC power supply, a pulsed DC sputtering method in which a DC bias is applied in a pulsed manner or the like can be employed.

In this embodiment, the case where the semiconductor layer 110 is formed to have a single-layer structure is described; however, the semiconductor layer 110 may have a stacked-layer structure. For example, instead of the above structure, a semiconductor layer (hereinafter called a "semiconductor layer with normal conductivity") having the same constituent as the semiconductor layer 110 is formed, and after that, a semiconductor layer (hereinafter called a "semiconductor layer with high conductivity") having constituent elements which are similar to those of the semiconductor layer 110 and having a constituent ratio thereof which is different from that of the semiconductor layer 110 is formed over the insulating layer 108. In this case, since the semiconductor layer with high conductivity is provided between a source electrode (or a drain electrode) and the semiconductor layer with normal conductivity, element characteristics can be improved.

The semiconductor layer with normal conductivity and the semiconductor layer with high conductivity can be formed by making film-formation conditions thereof different. In this case, it is preferable that a flow rate ratio of an oxygen gas to an argon gas in the film formation conditions of the semiconductor layer with high conductivity be smaller than that in the film formation conditions of the semiconductor layer with normal conductivity. More specifically, the semiconductor layer with high conductivity is formed in a rare gas (such as argon or helium) atmosphere or an atmosphere containing an oxygen gas at 10% or less and a rare gas at 90% or more. The semiconductor layer with normal conductivity is formed in an oxygen atmosphere or an atmosphere in which a flow rate ratio of an oxygen gas is to a rare gas is 1 or more. In such a manner, two kinds of semiconductor layers having different conductivities can be formed.

Further, in the case where the semiconductor layer 110 is formed without being exposed to the air after a plasma treatment is performed, dust or moisture can be prevented from being attached to an interface between the insulating layer 108 and the semiconductor layer 110.

Note that the thickness of the semiconductor layer 110 may be about 5 nm to 200 nm.

Figure 1E:
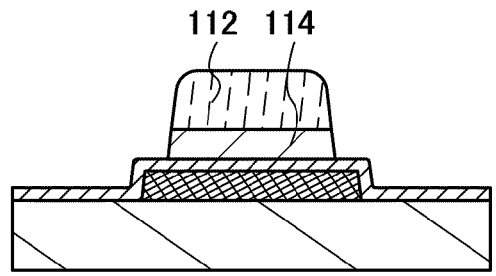

Next, a resist mask 112 is selectively formed over the semiconductor layer 110 and the semiconductor layer 110 is selectively etched using the resist mask 112, whereby a semiconductor layer 114 is formed (see FIG. 1E). Here, the resist mask 112 can be formed in a manner similar to the resist mask 104. Note that the resist mask 112 is removed after the semiconductor layer 114 is formed by etching the semiconductor layer 110.

Either wet etching or dry etching can be employed as an etching method used for the etching of the semiconductor layer 110. Here, an unnecessary portion of the semiconductor layer 110 is removed by wet etching using a mixed solution of acetic acid, nitric acid, and phosphoric acid, so that the semiconductor layer 114 is formed. Note that the etchant (the etching solution) used in the above wet etching may be any solution which can etch the semiconductor layer 110, and not limited to the above-described solution.

When dry etching is performed, for example, a gas including chlorine or a gas including chlorine to which oxygen is added is preferably used. This is because by using a gas including chlorine, etching selectivity of the semiconductor layer 110 with respect to the conductive layer or the base layer can be easily obtained.

As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. An ECCP (enhanced capacitively coupled plasma) mode etching apparatus may be used by which uniform electric discharge can be obtained over a wide area as compared with an ICP etching apparatus. This ECCP mode etching apparatus can be employed even when a substrate of the tenth generation or later is used.

Next, a conductive layer 116 is formed so as to cover an insulating layer 108 and a semiconductor layer 114 (see FIG.

2A). The conductive layer 116 can be formed using a material and by a method which are similar to those of the conductive layer 102. For example, the conductive layer 116 can be formed to have a single-layer structure of a molybdenum film or a titanium film. Alternatively, the conductive layer 116 may be formed to have a stacked-layer structure and can have a stacked-layer structure of an aluminum film and a titanium film, for example. A three-layer structure in which a titanium film, an aluminum film, and a titanium film are stacked in this order may be employed. A three-layer structure in which a molybdenum film, an aluminum film, and a molybdenum film are stacked in this order may be employed. Further, an aluminum film containing neodymium (an Al—Nd film) may be used as the aluminum film used for these stacked-layer structures. Further alternatively, the conductive layer 116 may have a single-layer structure of an aluminum film containing silicon.

Figure 2A:
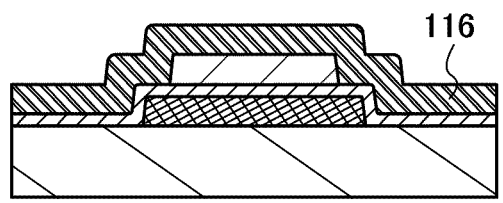
FIGS. 2A to 2D are cross-sectional views illustrating the method for manufacturing the semiconductor element included in the semiconductor device.
Figure 2B:
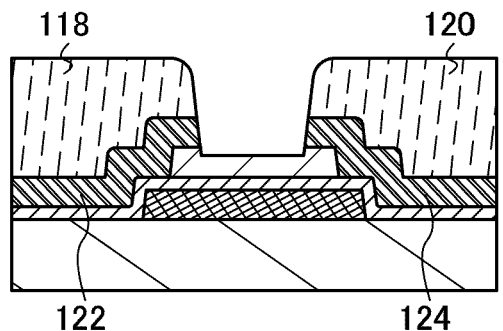

Next, a resist mask 118 and a resist mask 120 are selectively formed over the conductive layer 116 and the conductive layer 116 is selectively etched using the resist masks so as to form a conductive layer 122 which functions as one of source and drain electrodes and a conductive layer 124 which functions as the other of source and drain electrodes (see FIG. 2B). Here, the resist masks 118 and 120 can be formed in a manner similar to that of the resist mask 104. Note that the resist masks 118 and 120 are removed after the conductive layers 122 and 124 are formed by etching the conductive layer 116.

Either wet etching or dry etching can be employed as a method for etching the conductive layer 116. Here, an unnecessary portion of the conductive layer 116 is removed by dry etching so as to form the conductive layers 122 and 124.

Note that, although a structure (a channel etch type) in which part of the semiconductor layer 114 is removed when the conductive layer 116 is etched is employed in this embodiment, one embodiment of the disclosed invention is not limited to this. Instead, another structure (an etching stopper type) can be employed in which a layer (an etching stopper) which prevents the etching from proceeding is formed between the semiconductor layer 114 and the conductive layer 116, so that the semiconductor layer 114 is not etched.

After the conductive layers 122 and 124 are formed, a heat treatment is performed at 100° C. to 500° C., typically 200° C. to 400° C. The atmosphere in which the heat treatment is performed can be, for example, an air atmosphere, a nitrogen atmosphere, an oxygen atmosphere, an atmosphere containing water vapor, or the like. Further, the heat treatment time can be about 0.1 to 5 hours. Here, the heat treatment at 350° C. for one hour in an air atmosphere is performed. Note that the timing of the heat treatment is not particularly limited as long as it is after the semiconductor layer 110 is formed and before an insulating layer serving as an interlayer insulating layer is formed. For example, the heat treatment may be performed just after the semiconductor layer 110 is formed. Alternatively, the heat treatment may be performed just after the semiconductor layer 114 is formed or just after the conductive layer 116 is formed. By performing the heat treatment (the first heat treatment) and the following heat treatment (the second heat treatment), the characteristics of the semiconductor element can be improved dramatically and variation in the characteristics can be reduced.

Note that it is preferable that the above-described heat treatment be performed at 400° C. or lower so as not to change (deteriorate) the characteristics of the insulating layer 108 which functions as the gate insulating layer. Needless to say, one embodiment of the disclosed invention should not be interpreted as being limited thereto.

Figure 2C:
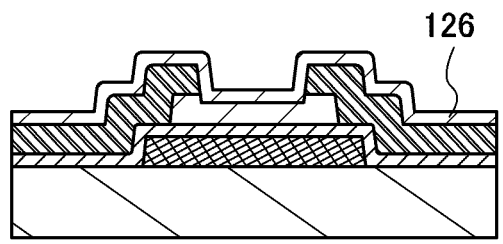

Next, the insulating layer 126 is formed so as to cover the conductive layer 122, the conductive layer 124, the semiconductor layer 114, and the like (see FIG. 2C). Here, the insulating layer 126 serves as a so-called interlayer insulating layer. The insulating layer 126 can be formed using a material such as silicon oxide, aluminum oxide, or tantalum oxide. The insulating layer 126 may also be formed by stacking films formed of these materials.

Since the insulating layer 126 is formed adjacent to the semiconductor layer 114, it is preferable that the composition of the insulating layer 126 fulfill a predetermined condition. Specifically, for example, the hydrogen concentration in the insulating layer 126 is preferably lower than the hydrogen concentration in the semiconductor layer 114 (or the semiconductor layer 110) (in other words, the hydrogen concentration in the semiconductor layer 114 is preferably higher than the hydrogen concentration in the insulating layer 126). Further, the nitrogen concentration in the insulating layer 126 is preferably lower than the nitrogen concentration in the semiconductor layer 114 (or the semiconductor layer 110) (in other words, the nitrogen concentration in the semiconductor layer 114 is preferably higher than the nitrogen concentration in the insulating layer 126). This is because it is likely that deterioration of element characteristics, which is due to dispersion of hydrogen (or nitrogen) from the insulating layer 126 into the semiconductor layer 114, can be suppressed by making the hydrogen concentration (or nitrogen concentration) in the insulating layer 126 lower than the hydrogen concentration (or nitrogen concentration) in the semiconductor layer 114.

Though depending on the formation condition of the semiconductor layer 114, the above-described condition is fulfilled when the hydrogen concentration in the insulating layer 126 is, for example, $1 \times 10^{21}$ atoms/cm$^3$ or lower (preferably $5 \times 10^{20}$ atoms/cm$^3$ or lower). Similarly, the above-described condition is fulfilled when the nitrogen concentration in the insulating layer 126 is $1 \times 10^{19}$ atoms/cm$^3$ or lower. Note that the above concentrations show the average values in the insulating layer 126.

As a more specific example of the insulating layer 126 fulfilling the above-described condition, a silicon oxide film formed by sputtering can be given. This is because, in the case of using a sputtering method, it is easy to reduce hydrogen concentration in the film as compared with the case of using a CVD method. Needless to say, any of other methods including a CVD method may be employed as long as the above condition is fulfilled. The other conditions of the insulating layer 126 are not particularly limited. For example, the thickness of the insulating layer 126 can vary within a feasible range.

Figure 2D:
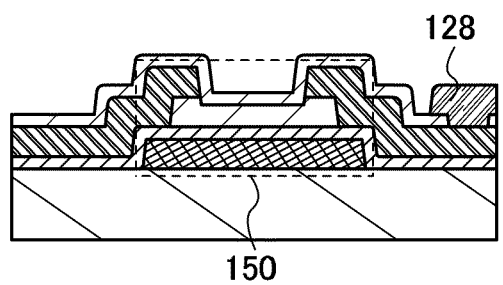

After that, a variety of electrodes and wirings are formed, whereby a semiconductor device provided with the transistor 150 is completed (see FIG. 2D). In this embodiment, a typical example is shown in which a conductive layer 128 functioning as a pixel electrode of a display device is formed (see FIG. 2D). However, one embodiment of the disclosed invention is not limited to this.

After the conductive layer 128 is formed, a heat treatment is performed at 100° C. to 500° C., typically, 200° C. to 400° C. The atmosphere in which the heat treatment is performed can be, for example, an air atmosphere, a nitrogen atmosphere, an oxygen atmosphere, an atmosphere containing water vapor, or the like. Further, the heat treatment time can be about 0.1 to 5 hours. Here, the heat treatment at 350° C. for one hour in an air atmosphere is performed. Note that the timing of the heat treatment is not particularly limited as long as it is after the formation of the insulating layer 126. For example, the above heat treatment may be performed just after the insulating layer 126 is formed. Alternatively, the above heat treatment may be performed after another insulating layer, conductive layer or the like is formed. By performing the heat treatment (the second heat treatment) and the preceding heat treatment (the first heat treatment), the characteristics of the semiconductor element can be improved dramatically and variation in the characteristics can be reduced.

Note that the effect of the second heat treatment is not limited to the above. For example, the second heat treatment also provides an advantageous effect of repairing defects in the insulating layer 126. Since the insulating layer 126 is formed at a relatively low temperature, defects exist in the film. The element characteristics might be adversely affected when the insulating layer 126 is used as it is. From a perspective of repairing such defects in the insulating layer 126, it can be said that the above-described heat treatment plays an important role.

In addition, it is preferable that the heat treatment be performed at 400° C. or lower so as not to change (deteriorate) the characteristics of the insulating layer 108 which functions as the gate insulating layer. Needless to say, one embodiment of the disclosed invention should not be interpreted as being limited thereto.

As shown in this embodiment, a semiconductor element having excellent characteristics can be provided by performing both of the following heat treatment: the heat treatment after the step of forming the semiconductor layer 110 and before the step of forming the insulating layer 126; and the heat treatment after the step of forming the insulating layer 126. Accordingly, a semiconductor device including a semiconductor element which has excellent characteristics can be provided.

Embodiment 2

In this embodiment, an example, which is different from the above embodiment, of a method for manufacturing a semiconductor element used for a semiconductor device is described with reference to drawings. Note that many parts of a method for manufacturing a semiconductor device in this embodiment are the same as those in Embodiment 1. Therefore, in the following description, repeated description of the same portions is omitted, and different points are described in detail.

Figure 3A:
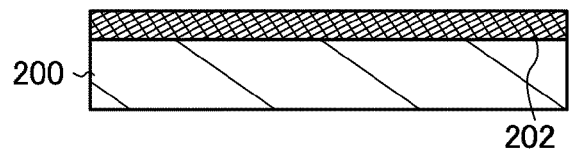
FIGS. 3A to 3E are cross-sectional views illustrating a method for manufacturing a semiconductor element included in a semiconductor device.

First, a conductive layer 202 is formed over a substrate 200 (see FIG. 3A). The previous embodiment (the description with reference to FIG. 1A or the like) can be referred to for the details of the substrate 200, the conductive layer 202, or the like. A base layer may be formed over the substrate 200. The previous embodiment can also be referred to for the detail of the base layer.

Figure 3B:
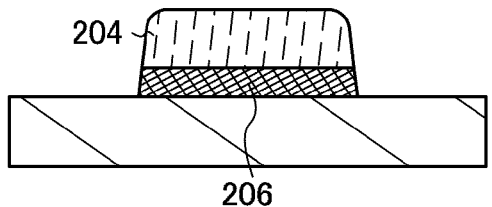

Next, a resist mask 204 is selectively formed over the conductive layer 202 and the conductive layer 202 is selectively etched using the resist mask 204, whereby a conductive layer 206 which functions as a gate electrode is formed (see FIG. 3B). The previous embodiment (the description with reference to FIG. 1B or the like) can be referred to for the details of the resist mask 204, the conductive layer 206, the etching, or the like.

Figure 3C:
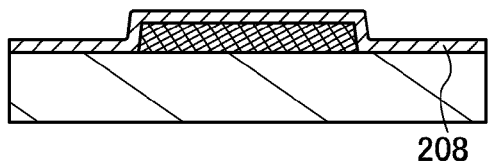

Then, an insulating layer 208 which functions as a gate insulating layer is formed so as to cover the conductive layer 206 (see FIG. 3C). The previous embodiment (the description with reference to FIG. 1C or the like) can be referred to for the detail of the insulating layer 208 or the like.

Figure 3D:
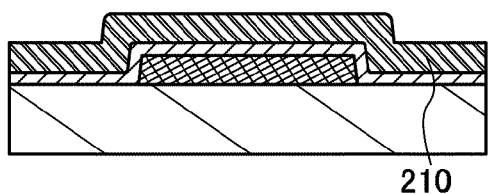

A conductive layer 210 is formed so as to cover the insulating layer 208 (see FIG. 3D). The conductive layer 210 can be formed using a material and by a method which are similar to those of the conductive layer 202. In other words, the previous embodiment (the description with reference to FIG. 1A and FIG. 2A or the like) can be referred to for the details.

Figure 3E:
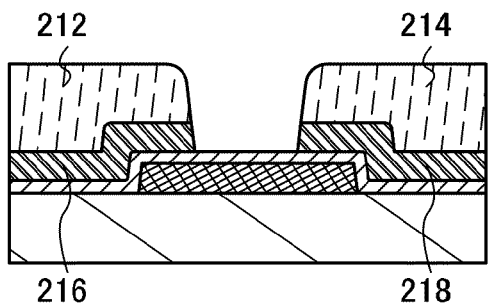

Next, a resist mask 212 and a resist mask 214 are selectively formed over the conductive layer 210 and the conductive layer 210 is selectively etched using the resist masks so as to form a conductive layer 216 which functions as one of the source and drain electrodes and a conductive layer 218 which functions as the other of source and drain electrodes (see FIG. 3E). Here, the resist masks 212 and 214 can be formed in manner similar to the resist mask 204. In other words, the previous embodiment (the description with reference to FIG. 1B and FIG. 2B or the like) can be referred to for the details of the resist masks.

Either wet etching or dry etching can be employed as a method for etching the conductive layer 210. Here, an unnecessary portion of the conductive layer 210 is removed by dry etching so as to form the conductive layers 216 and 218. Note that although not illustrated in this embodiment, part of the insulating layer 208 is removed by the etching in some cases.

Figure 4A:
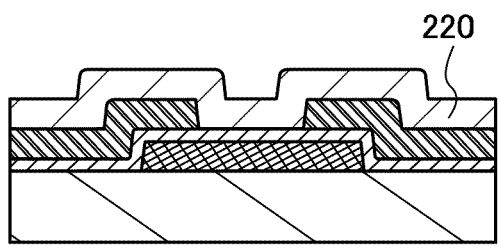
FIGS. 4A to 4D are cross-sectional views illustrating the method for manufacturing the semiconductor element included in the semiconductor device.

Next, a semiconductor layer 220 is formed so as to cover the insulating layer 208, the conductive layer 216, the conductive layer 218 and the like (see FIG. 4A). The previous embodiment (the description with reference to FIG. 1D or the like) can be referred to for the detail of the semiconductor layer 220.

Figure 4B:
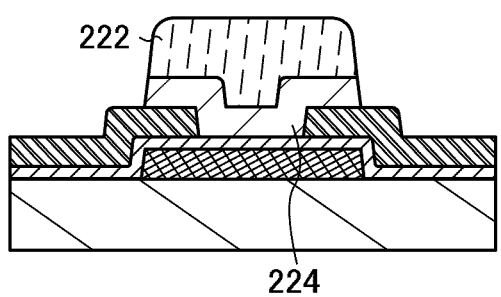

Next, a resist mask 222 is selectively formed over the semiconductor layer 220 and the semiconductor layer 220 is selectively etched using the resist mask 222 so as to form a semiconductor layer 224 (see FIG. 4B). The previous embodiment (the description with reference to FIGS. 1B and 1E or the like) can be referred to for the detail of the resist mask 222.

Either wet etching or dry etching can be employed as a method for etching the semiconductor layer 220. Here, an unnecessary portion of the semiconductor layer 220 is removed by wet etching using a mixed solution of acetic acid, nitric acid, and phosphoric acid, so that a semiconductor layer 224 is formed. Note that the etchant (the etching solution) used in the above wet etching may be any solution which can etch the semiconductor layer 220, and not limited to the above-described solution.

When dry etching is performed, a gas including chlorine or a gas including chlorine to which oxygen is added is preferably used. This is because by using a gas including chlorine, etching selectivity of the semiconductor layer 220 with respect to the conductive layer or the base layer can be easily obtained. Note that the previous embodiment can be referred to for the detail of the etching or the like.

After the semiconductor layer 224 is formed, a heat treatment at 100° C. to 500° C., typically 200° C. to 400° C., is performed. The atmosphere in which the heat treatment is performed can be, for example, an air atmosphere, a nitrogen atmosphere, an oxygen atmosphere, an atmosphere containing water vapor, or the like. Further, the heat treatment time can be about 0.1 to 5 hours. Here, the heat treatment at 350° C. for one hour in an air atmosphere is performed. Note that the timing of the heat treatment is not particularly limited as long as it is after the semiconductor layer 220 is formed and before an insulating layer serving as an interlayer insulating layer is formed. For example, the above heat treatment may be performed just after the semiconductor layer 220 is formed. By performing both the heat treatment (the first heat treatment) and the following heat treatment (the second heat treatment), the characteristics of the semiconductor element can be improved dramatically and variation in the characteristics can be reduced.

Note that it is preferable that the heat treatment be performed at 400° C. or lower so as not to change (deteriorate) the characteristics of the insulating layer 208 which functions as the gate insulating layer. Needless to say, one embodiment of the disclosed invention should not be interpreted as being limited thereto.

Figure 4C:
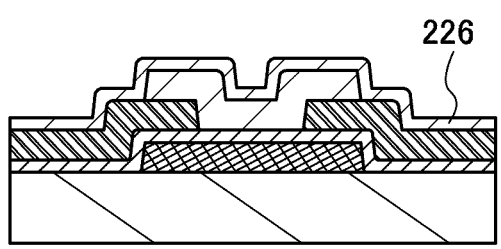

Then, an insulating layer 226 is formed so as to cover the conductive layer 216, the conductive layer 218, the semiconductor layer 224 and the like (see FIG. 4C). Here, the insulating layer 226 serves as a so-called interlayer insulating layer. The insulating layer 226 can be formed using a material such as silicon oxide, aluminum oxide, or tantalum oxide. The insulating layer 226 may also be formed by stacking films formed of these materials.

Since the insulating layer 226 is formed adjacent to the semiconductor layer 224, it is preferable that the composition of the insulating layer 226 fulfill a predetermined condition. Specifically, for example, the hydrogen concentration in the insulating layer 226 is preferably lower than the hydrogen concentration in the semiconductor layer 224 (or the semiconductor layer 220) (in other words, the hydrogen concentration in the semiconductor layer 224 is preferably higher than the hydrogen concentration in the insulating layer 226). Further, the nitrogen concentration in the insulating layer 226 is preferably lower than the nitrogen concentration in the semiconductor layer 224 (or the semiconductor layer 220) (in other words, the nitrogen concentration in the semiconductor layer 224 is preferably higher than the nitrogen concentration in the insulating layer 226). This is because it is likely that deterioration of element characteristics, which is due to dispersion of hydrogen (or nitrogen) from the insulating layer 226 into the semiconductor layer 224, is suppressed by making the hydrogen concentration (or nitrogen concentration) in the insulating layer 226 lower than the hydrogen concentration (or nitrogen concentration) in the semiconductor layer 224.

Though depending on the formation condition of the semiconductor layer 224, the above-described condition is fulfilled when the hydrogen concentration in the insulating layer 226 is, for example, $1 \times 10^{21}$ atoms/cm$^3$ or lower (preferably $5 \times 10^{20}$ atoms/cm$^3$ or lower). Similarly, the above-described condition is fulfilled when the nitrogen concentration in the insulating layer 226 is $1 \times 10^{19}$ atoms/cm$^3$ or lower. Note that the above concentrations show the average values in the insulating layer 226.

As a more specific example of the insulating layer 226, which fulfills the above-described condition, a silicon oxide film formed by sputtering can be given. This is because, in the case of using a sputtering method, it is easy to reduce hydrogen concentration in the film as compared with the case of using a CVD method. Needless to say, any of other methods including a CVD method may be employed as long as the above condition is fulfilled. The other conditions of the insulating layer 226 are not particularly limited. For example, the thickness of the insulating layer 226 can vary within a feasible range.

Figure 4D:
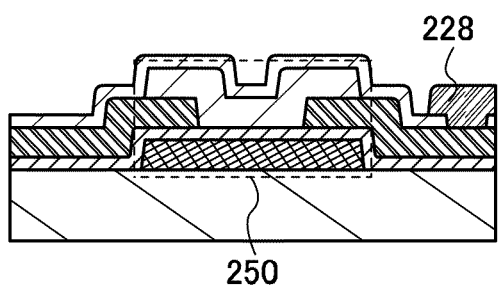

After that, a variety of electrodes and wirings are formed, whereby a semiconductor device provided with a transistor 250 is completed (see FIG. 4D). In this embodiment, a typical example is shown in which a conductive layer 228 which functions as a pixel electrode of a display device is formed (see FIG. 4D). However, one embodiment of the disclosed invention is not limited to this.

In addition, after the conductive layer 228 is formed, a heat treatment is performed at 100° C. to 500° C., typically 200° C. to 400° C. The atmosphere in which the heat treatment is performed can be, for example, an air atmosphere, a nitrogen atmosphere, an oxygen atmosphere, an atmosphere containing water vapor, or the like. Further, the heat treatment time may be about 0.1 to 5 hours. Here, the heat treatment at 350° C. for one hour in an air atmosphere is performed. Note that the timing of the heat treatment is not particularly limited as long as it is after the insulating layer 226 is formed. For example, the above heat treatment may be performed just after the insulating layer 226 is formed. Alternatively, the above heat treatment may be performed after another insulating layer, conductive layer or the like is formed. By performing the heat treatment (the second heat treatment) and the preceding heat treatment (the first heat treatment), the characteristics of the semiconductor element can be improved dramatically and variation in characteristics can be reduced.

Note that the effect of the second heat treatment is not limited to the above. For example, the second heat treatment also provides an advantageous effect of repairing defects in the insulating layer 226. Since the insulating layer 226 is formed at a relatively low temperature, defects exist in the film. The element characteristics might be adversely affected when the insulating layer is used as it is. From a perspective of repairing such defects in the insulating layer 226, it can be said that the above-described heat treatment plays an important role.

Note that it is preferable that the heat treatment be performed at 400° C. or lower so as not to change (deteriorate) the characteristics of the insulating layer 208 which functions as the gate insulating layer. Needless to say, one embodiment of the disclosed invention should not be interpreted as being limited thereto.

As shown in this embodiment, a semiconductor element having excellent characteristics can be provided by performing both of the following heat treatment: the heat treatment after the step of forming the semiconductor layer 220 and before the step of forming the insulating layer 226; and the heat treatment after the step of forming the insulating layer 226. Accordingly, a semiconductor device including a semiconductor element which has excellent characteristics can be provided.

Note that this embodiment can be implemented in combination with the previous embodiment as appropriate.

Embodiment 3

Figure 7:
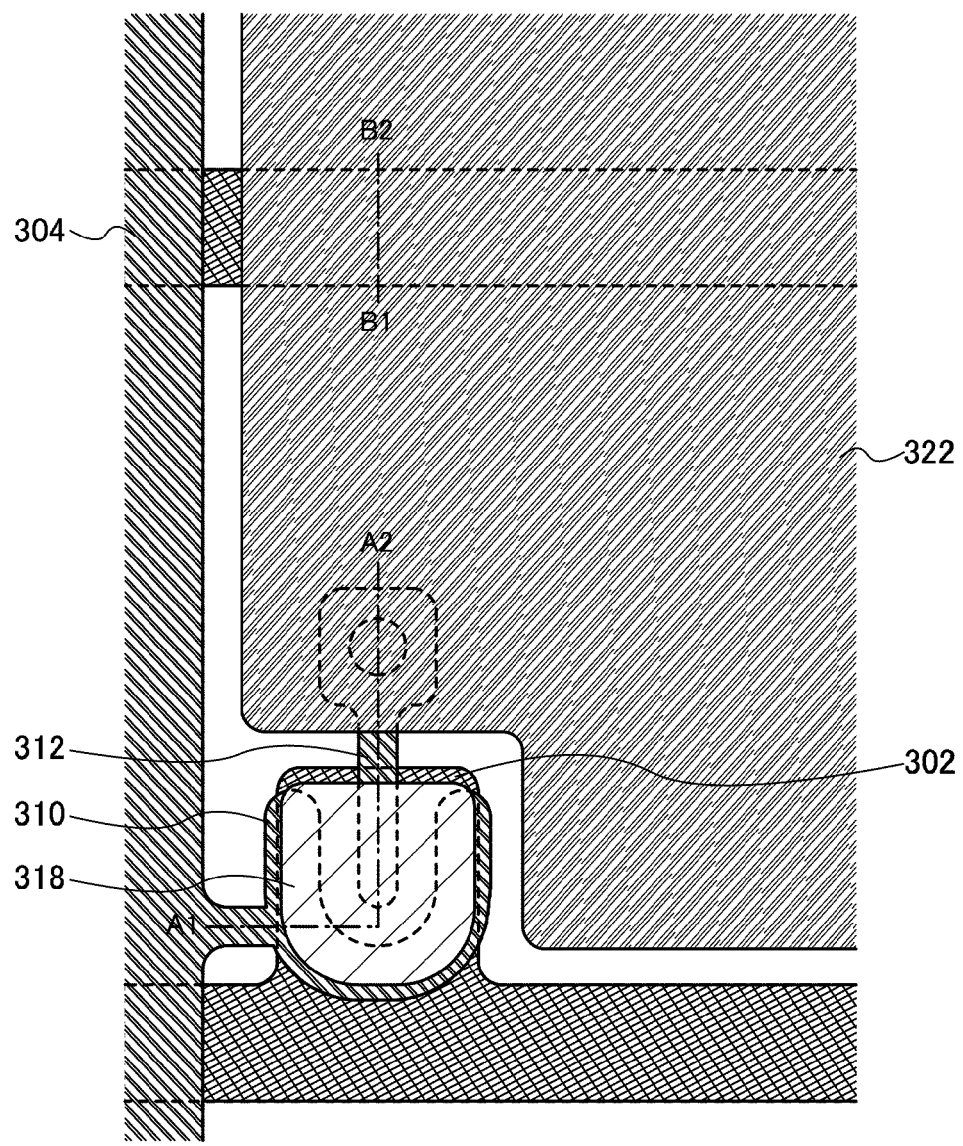
FIG. 7 is a plan view of the semiconductor device.

In this embodiment, a manufacturing process of an active matrix substrate which is an example of a semiconductor device is described with reference to drawings. Note that many parts of the manufacturing process described in this embodiment are the same as those in the previous embodiments. Therefore, in the following description, repeated description of the same portions is omitted, and different points are described in detail. Note that in the following description, FIGS. 5A to 5C and FIGS. 6A to 6C are cross-sectional views and FIG. 7 is a plan view. In addition, line A1-A2 and line B1-B2 in each of FIGS. 5A to 5C and FIGS. 6A to 6C correspond to line A1-A2 and line B1-B2 in FIG. 7, respectively. Note also that in this embodiment, a semiconductor element illustrated in a structure taken along line A1-A2 is similar to the semiconductor element described in the previous embodiment (Embodiment 2).

First, a wiring and an electrode (a gate electrode 302, a capacitor wiring 304, and a first terminal 306) is formed over a substrate 300 (see FIG. 5A). Specifically, after a conductive layer is formed over the substrate, the wiring and electrode are formed through an etching using a resist mask. In this embodiment, the wiring and electrode can be formed by a method similar to the method which is shown in any of the previous embodiments; therefore, the previous embodiments (the description with reference to FIGS. 1A and 1B, FIGS. 3A and 3B, or the like) can be referred to for the details. Note that in the above description, the distinction between "an electrode" and "a wiring" is made only for convenience, and their functions are not limited by the denomination of "the electrode" or "the wiring". For instance, a gate electrode is referred to as an equal of a gate electrode in some cases.

Note that the capacitor wiring 304 and the first terminal 306 can be formed at the same time using the same material and the same manufacturing method as the gate electrode 302. Therefore, for example, the gate electrode 302 and the first terminal 306 can be electrically connected. The previous embodiments can be referred to for the details of the material and the manufacturing method of the gate electrode 302.

Next, a gate insulating layer 308 is formed over the gate electrode 302 and the gate insulating layer 308 is selectively etched so as to expose the first terminal 306, whereby a contact hole is formed (see FIG. 5B). There is no particular limitation on the etching treatment. The previous embodiments (the description with reference to FIG. 1C, FIG. 3C, or the like) can be referred to for the detail of the gate insulating layer 308. There is no particular limitation on the etching treatment; dry etching may be used, or wet etching may be used.

Next, after a conductive layer covering the gate insulating layer 308 and the first terminal 306 is formed, the conductive layer is selectively etched, so that a source electrode 310 (or a drain electrode), a drain electrode 312 (or a source electrode), a connection electrode 314, and a second terminal 316 are formed (see FIG. 5C). Note that in the above description, the distinction between "an electrode" and "a wiring" is made only for convenience, and their functions are not limited by the denomination of "the electrode" or "the wiring". For instance, a source electrode is referred to as an equal of a source electrode in some cases.

The previous embodiment (the description with reference to FIGS. 2A and 2B, FIGS. 3D and 3E, or the like) can be referred to for the material, the manufacturing method, the etching treatment, or the like of the above conductive layer. Note that by performing dry etching in the etching treatment, a wiring structure can be miniaturized as compared with the case of using wet etching. For example, the connection electrode 314 can be directly connected to the first terminal 306 through the contact hole formed in the gate insulating layer 308. Note also that the second terminal 316 can be electrically connected to the source electrode 310.

Next, after a semiconductor layer is formed so as to cover at least the source electrode 310 and the drain electrode 312, the semiconductor layer is selectively etched to form a semiconductor layer 318 (see FIG. 6A). Here, the semiconductor layer 318 is in contact with parts of the source electrode 310 and the drain electrode 312. The previous embodiments (the description with reference to FIGS. 1D and 1E, FIGS. 4A and 4B, or the like) can be referred to for the detail of the semiconductor layer 318.

After the semiconductor layer 318 is formed, a heat treatment at 100° C. to 500° C., typically 200° C. to 400° C., is performed. The atmosphere in which the heat treatment is performed can be, for example, an air atmosphere, a nitrogen atmosphere, an oxygen atmosphere, an atmosphere containing water vapor, or the like. Further, the heat treatment time can be about 0.1 to 5 hours. Here, the heat treatment at 350° C. for one hour in an air atmosphere is performed. Note that the timing of the heat treatment is not particularly limited as long as it is after the semiconductor layer 318 is formed and before an insulating layer serving as an interlayer insulating layer is formed. For example, the heat treatment may be performed just after the semiconductor layer 318 is formed. By performing the heat treatment (the first heat treatment) and the following heat treatment (the second heat treatment), the characteristics of the semiconductor element can be improved dramatically and variation in characteristics can be reduced.

Note that it is preferable that the heat treatment be performed at 400° C. or lower so as not to change (deteriorate) the characteristics of the gate insulating layer 308. Needless to say, one embodiment of the disclosed invention should not be interpreted as being limited thereto.

Then, an insulating layer 320 is formed so as to cover the source electrode 310, the drain electrode 312, the semiconductor layer 318, and the like and the insulating layer 320 is selectively etched so as to form contact holes which reach the drain electrode 312, the connection electrode 314, and the second terminal 316 (see FIG. 6B). The insulating layer 320 can be formed using a material such as silicon oxide, aluminum oxide, or tantalum oxide. The insulating layer 320 may also be formed by stacking films formed of these materials.

Since the insulating layer 320 is formed adjacent to the semiconductor layer 318, it is preferable that the composition of the insulating layer 320 fulfill a predetermined condition. Specifically, for example, the hydrogen concentration in the insulating layer 320 is preferably lower than the hydrogen concentration in the semiconductor layer 318 (in other words, the hydrogen concentration in the semiconductor layer 318 is preferably higher than the hydrogen concentration in the insulating layer 320). Further, the nitrogen concentration in the insulating layer 320 is preferably lower than the nitrogen concentration in the semiconductor layer 318 (in other words, the nitrogen concentration in the semiconductor layer 318 is preferably higher than the nitrogen concentration in the insulating layer 320). This is because it is likely that deterioration of element characteristics, which is due to dispersion of hydrogen (or nitrogen) from the insulating layer 320 into the semiconductor layer 318, is suppressed by making the hydrogen concentration (or nitrogen concentration) in the insulating layer 320 lower than the hydrogen concentration (or nitrogen concentration) in the semiconductor layer 318.

Though depending on the formation condition of the semiconductor layer 318, the above-described condition is fulfilled when the hydrogen concentration in the insulating layer 320 is, for example, $1\times10^{21}$ atoms/cm$^3$ or lower (preferably $5\times10^{20}$ atoms/cm$^3$ or lower). Similarly, the above-described condition is fulfilled when the nitrogen concentration in the insulating layer 320 is $1\times10^{19}$ atoms/cm$^3$ or lower. Note that the above concentrations show the average values in the insulating layer 320.

As a more specific example of the insulating layer 320, which fulfills the above-described condition, a silicon oxide film formed by sputtering can be given. This is because, in the case of using a sputtering method, it is easy to reduce hydrogen concentration in the film as compared with the case of using a CVD method. Needless to say, any of other methods including a CVD method may be employed as long as the above condition is fulfilled. The other conditions of the insulating layer 320 are not particularly limited. For example, the thickness of the insulating layer 320 can vary within a feasible range.

Next, a transparent conductive layer 322 which is electrically connected to the drain electrode 312, a transparent conductive layer 324 which is electrically connected to the connection electrode 314, and a transparent conductive layer 326 which is electrically connected to the second terminal 316 are formed (see FIG. 6C and FIG. 7).

The transparent conductive layer 322 functions as a pixel electrode and the transparent conductive layers 324 and 326 function as an electrode or a wiring used for connection with a flexible printed circuit (an FPC). More specifically, the transparent conductive layer 324 formed over the connection electrode 314 can be used as a terminal electrode for connection which functions as an input terminal of a gate wiring, and the transparent conductive layer 326 formed over the second terminal 316 can be used as a terminal electrode for connection which functions as an input terminal of a source wiring.

In addition, a storage capacitor can be formed using the capacitor wiring 304, the gate insulating layer 308, and the transparent conductive layer 322.

The transparent conductive layers 322, 324, and 326 can be formed using a material such as indium oxide ($In_2O_3$), indium oxide tin oxide alloy ($In_2O_3$—$SnO_2$, abbreviated as ITO), or indium oxide zinc oxide alloy ($In_2O_3$—$ZnO$). For example, after the film containing the above material is formed by a sputtering method, a vacuum evaporation method, or the like, an unnecessary portion is removed by etching, whereby the transparent conductive layers 322, 324, and 326 may be formed.

In addition, after the conductive layers 322, 324, and 326 are formed, a heat treatment is performed at 100° C. to 500° C., typically 200° C. to 400° C. The atmosphere in which the heat treatment is performed can be, for example, an air atmosphere, a nitrogen atmosphere, an oxygen atmosphere, an atmosphere containing water vapor, or the like. Further, the heat treatment time can be about 0.1 to 5 hours. Here, the heat treatment at 350° C. for one hour in an air atmosphere is performed. Note that the timing of the heat treatment is not particularly limited as long as it is after the insulating layer 320 is formed. For example, the above heat treatment may be performed just after the insulating layer 320 is formed. Alternatively, the above heat treatment may be performed after the contact holes are formed in the insulating layer 320. Further alternatively, the above heat treatment may be performed after another insulating layer, conductive layer or the like is formed. By performing the heat treatment (the second heat treatment) and the preceding heat treatment (the first heat treatment), the characteristics of the semiconductor element can be improved dramatically and variation in characteristics can be reduced.

Note that the effect of the second heat treatment is not limited to the above. For example, the second heat treatment also provides an advantageous effect of repairing defects in the insulating layer 320. Since the insulating layer 320 is formed at a relatively low temperature, defects exist in the film. Thus, the element characteristics might be adversely affected when the insulating layer is used as it is. From a perspective of repairing such defects in the insulating layer 320, it can be said that the above-described heat treatment plays an important role.

Note that it is preferable that the heat treatment be performed at 400° C. or lower so as not to change (deteriorate) the characteristics of the gate insulating layer 308. Needless to say, one embodiment of the disclosed invention should not be interpreted as being limited thereto.

Through the above steps, an active matrix substrate including a bottom-gate transistor 350 and an element such as a storage capacitor can be completed. For example, in the case of manufacturing an active matrix liquid crystal display device by using this, a liquid crystal layer may be provided between an active matrix substrate and a counter substrate provided with a counter electrode, and the active matrix substrate and the counter substrate may be fixed to each other.

As shown in this embodiment, a semiconductor element having excellent characteristics can be provided by performing both of the following heat treatment: the heat treatment after the step of forming the semiconductor layer 318 and before the step of forming the insulating layer 320; and the heat treatment after the step of forming the insulating layer 320. Accordingly, a semiconductor device including a semiconductor element which has excellent characteristics can be provided.

Note that although the case where the transistor 350 or other structures are formed using the method shown in Embodiment 2 is described, the disclosed invention is not limited to this. The method shown in Embodiment 1 may be used. Note that this embodiment can be implemented in combination with any of the previous embodiments as appropriate.

Embodiment 4

In this embodiment, an example is described where a thin film transistor is manufactured and a semiconductor device having a display function (also referred to as a display device) is manufactured using the thin film transistor in a pixel portion and in a driver circuit. Further, part or whole of a driver circuit can be formed over the same substrate as a pixel portion, whereby a system-on-panel can be obtained.

The display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, may be used.

In addition, the display device includes a panel in which a display element is sealed, and a module in which an IC and the like including a controller are mounted on the panel. Furthermore, an element substrate which forms a display device is provided with means for supplying current to the display element in each of pixel portions. Specifically, the element substrate may be in a state after only a pixel electrode of the display element is formed, or a state after a conductive film to be a pixel electrode is formed and before the conductive film is etched.

Note that a display device in this specification means an image display device, a display device, a light source (including a lighting device), and the like. Further, the display device also includes the following modules in its category: a module to which a connector such as an FPC (flexible printed circuit), a TAB (tape automated bonding) tape, or a TCP (tape carrier package) is attached; a module in which the tip of the TAB tape or the TCP is provided with a printed wiring board; a module in which an IC (integrated circuit) is directly mounted on a display element by a COG (chip on glass) method, and the like.

Hereinafter, in this embodiment, an example of a liquid crystal display device is described. FIGS. 8A1, 8A2, and 8B are plan views and a cross-sectional view of a panel in which thin film transistors 4010 and 4011 and a liquid crystal element 4013 which are formed over a first substrate 4001 are sealed by a second substrate 4006 and a sealant 4005. Here, FIGS. 8A1 and 8A2 each are a plan view and FIG. 8B is a cross-sectional view taken along the line M-N of FIGS. 8A1 and 8A2.

The sealant 4005 is provided so as to surround a pixel portion 4002 and a scanning line driver circuit 4004 that are provided over the first substrate 4001. The second substrate 4006 is provided over the pixel portion 4002 and the scanning line driver circuit 4004. In other words, the pixel portion 4002 and the scanning line driver circuit 4004 are sealed together with a liquid crystal layer 4008, by the first substrate 4001, the sealant 4005, and the second substrate 4006. Further, a signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used as appropriate. FIG. 8A1 illustrates an example of mounting the signal line driver circuit 4003 by a COG method, and FIG. 8A2 illustrates an example of mounting the signal line driver circuit 4003 by a TAB method.

In addition, the pixel portion 4002 and the scanning line driver circuit 4004 provided over the first substrate 4001 each include a plurality of thin film transistors. FIG. 8B illustrates the thin film transistor 4010 included in the pixel portion 4002 and the thin film transistor 4011 included in the scanning line driver circuit 4004. An insulating layer 4020 and an insulating layer 4021 are provided over the thin film transistors 4010 and 4011.

The transistors shown in any of the previous embodiments or the like can be applied to the thin film transistors 4010 and 4011. Note that in this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. The liquid crystal element 4013 is formed by the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that as the first substrate 4001 and the second substrate 4006, glass, metal (typically, stainless steel), ceramic, plastic, or the like can be used. As plastic, an FRP (fiberglass-reinforced plastics) substrate, a PVF (polyvinyl fluoride) film, a polyester film, an acrylic resin film, or the like can be used. In addition, a sheet with a structure in which an aluminum foil is sandwiched between PVF films or polyester films can be used.

A columnar spacer 4035 is provided in order to control the distance (a cell gap) between the pixel electrode layer 4030 and the counter electrode layer 4031. The columnar spacer 4035 can be obtained by selectively etching an insulating film. Note that a spherical spacer may be used instead of a columnar spacer. In addition, the counter electrode layer 4031 is electrically connected to a common potential line formed over the same substrate as the thin film transistor 4010. For example, the counter electrode layer 4031 can be electrically connected to the common potential line through conductive particles provided between the pair of substrates. Note that the conductive particles are preferably contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is preferably used. Thus, the temperature range can be improved. The liquid crystal composition which includes a liquid crystal showing a blue phase and a chiral agent has a small response time of 10 µs to 100 µs, has optical isotropy, which makes the alignment process unneeded, and has a small viewing angle dependence.

Although an example of a transmissive liquid crystal display device is described in this embodiment, the present invention is not limited thereto. An embodiment of the present invention may also be applied to a reflective liquid crystal display device or a semi-transmissive liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. In addition, the stacked-layer structure of the polarizing plate and the coloring layer is not limited to this embodiment. The stacked-layer structure can be varied as appropriate in accordance with the material, manufacturing conditions, or the like of the polarizing plate and the coloring layer. Further, a light-blocking film which functions as a black matrix may be provided.

In this embodiment, in order to reduce the surface roughness of the thin film transistor, the thin film transistors obtained in any of the previous embodiments are covered with the insulating layer 4021. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Here, a siloxane-based resin is a resin formed from a siloxane-based material as a starting material and having the bond of Si—O—Si. As a substituent, an organic group (e.g., an alkyl group or an aryl group) or a fluoro group may be used. In addition, the organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (an inkjet method, screen printing, offset printing, or the like), a doctor knife, a roll coater, a curtain coater, a knife coater, or the like.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

A conductive composition containing a conductive high molecule (also referred to as a conductive polymer) may be used for the pixel electrode layer 4030 and the counter electrode layer 4031. The pixel electrode made of the conductive composition preferably has a sheet resistance of $1.0 \times 10^4$ Ω/sq. or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive high molecule can be used. For example, polyaniline or a derivative thereof, polypyrrole or a derivative thereof, polythiophene or a derivative thereof, or a copolymer of two or more kinds of them can be given.

A variety of signals are supplied to the signal line driver circuit 4003, the scanning line driver circuit 4004, the pixel portion 4002, or the like from an FPC 4018.

In addition, a connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 8A1, 8A2 and 8B illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 9:
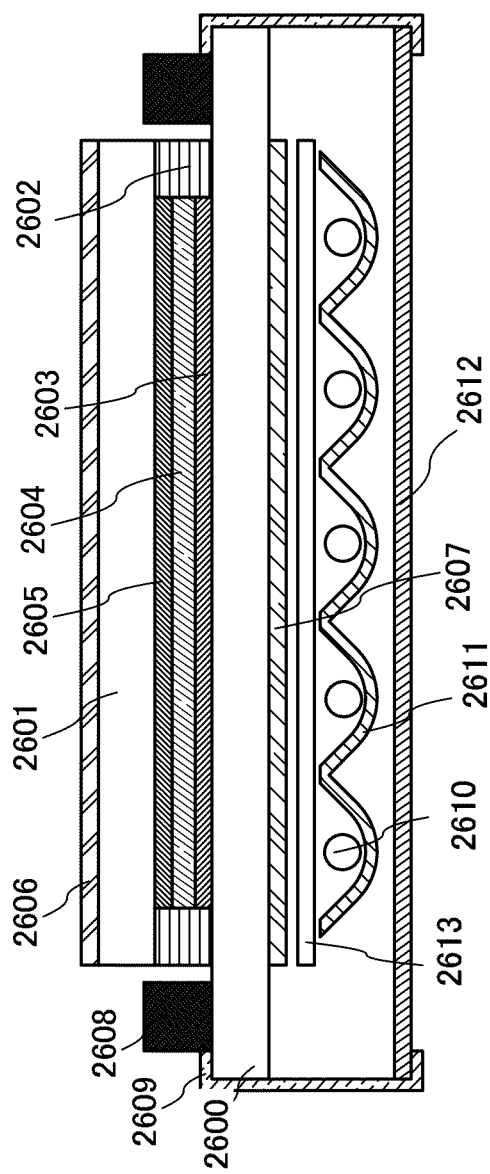
FIG. 9 is a drawing illustrating a semiconductor device.

FIG. 9 illustrates an example where a liquid crystal display module which corresponds to one embodiment of a semiconductor device is formed using a TFT substrate 2600.

In FIG. 9, the TFT substrate 2600 and a counter substrate 2601 are bonded to each other by a sealant 2602 and an element layer 2603 including a TFT and the like, a liquid crystal layer 2604 including an alignment film and a liquid crystal layer, a coloring layer 2605, a polarizing plate 2606, and the like are provided between the TFT substrate 2600 and the counter substrate 2601, whereby a display region is formed. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609. Thus, an external circuit such as a control circuit or a power source circuit is included in a liquid crystal module. A retardation plate may be provided between the polarizing plate and the liquid crystal layer.

For a driving method of a liquid crystal, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above steps, a high-performance liquid crystal display device can be manufactured. Note that this embodiment can be implemented in combination with any of the previous embodiments as appropriate.

Embodiment 5

In this embodiment, active matrix electronic paper which is an example of a semiconductor device is described with reference to FIG. 10. A thin film transistor 650 used for the semiconductor device can be manufactured in a manner similar to that of the thin film transistor or the like described in the previous embodiments.

Figure 10:
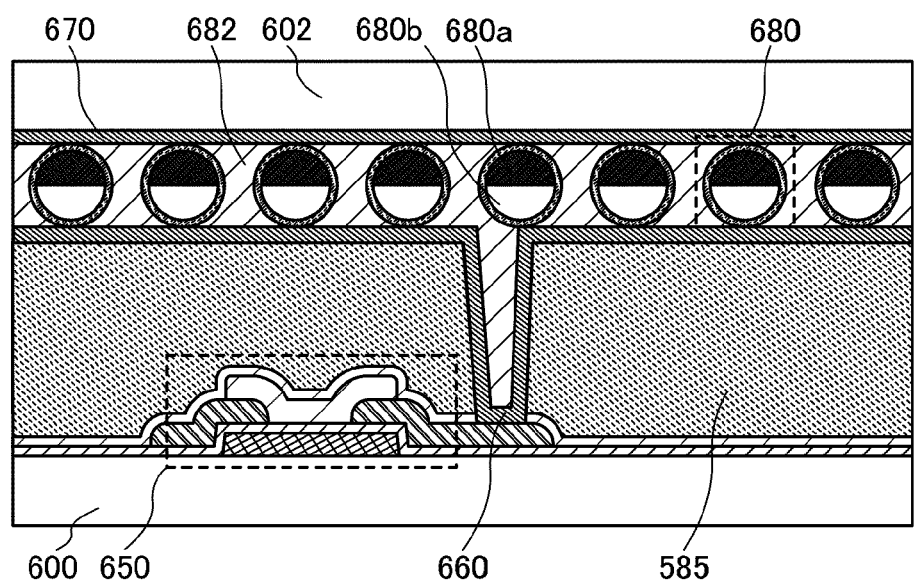
FIG. 10 is a drawing illustrating a semiconductor device.

The electronic paper in FIG. 10 is an example of a display device using a twisting ball display system. The twisting ball display system refers to a method in which spherical particles each colored in black and white are arranged between a first electrode layer and a second electrode layer, and a potential difference is generated between the first electrode layer and the second electrode layer, whereby orientation of the spherical particles is controlled, so that display is performed.

The source or drain electrode layer of the thin film transistor 650 is electrically connected to a first electrode layer 660 through a contact hole formed in an insulating layer. A substrate 602 is provided with a second electrode layer 670. Between the first electrode layer 660 and the second electrode layer 670, spherical particles 680 each having a black region 680*a* and a white region 680*b* are provided. A space around the spherical particles 680 is filled with a filler 682 such as a resin (see FIG. 10). In FIG. 10, the first electrode layer 660 corresponds to a pixel electrode, and the second electrode layer 670 corresponds to a common electrode. The second electrode layer 670 is electrically connected to a common potential line provided over the same substrate as the thin film transistor 650.

Instead of the twisting ball, an electrophoretic display element can also be used. In that case, for example, a microcapsule having a diameter of approximately 10 μm to 200 μm in which transparent liquid, positively-charged white microparticles, and negatively-charged black microparticles are encapsulated, is preferably used. When an electric field is applied between the first electrode layer and the second electrode layer, the white microparticles and the black microparticles move to opposite sides from each other, so that white or black is displayed. The electrophoretic display element has higher reflectance than a liquid crystal display element, and thus, an auxiliary light is unnecessary and a display portion can be recognized in a place where brightness is not sufficient. In addition, there is an advantage that even when power is not supplied to the display portion, an image which has been displayed once can be maintained.

Through the above steps, high-performance electronic paper can be manufactured using one embodiment of the present invention disclosed. Note that this embodiment can be implemented in combination with any of the previous embodiments as appropriate.

Embodiment 6

In this embodiment, description is made on a light-emitting display device which is an example of a semiconductor device. Here, a case is described where a light-emitting element utilizing electroluminescence is used as a display element. Note that light-emitting elements utilizing electroluminescence are classified by whether a light-emitting material is an organic compound or an inorganic compound. In general, the former is called an organic EL element, and the latter is called an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, thereby emitting light. Owing to such a mechanism, the light-emitting element is called a current-excitation light-emitting element.

The inorganic EL elements are classified into a dispersion-type inorganic EL element and a thin-film-type inorganic EL element depending on their element structures. A dispersion-type inorganic EL element has a light-emitting layer where particles of a light-emitting material are dispersed in a binder, and its light emission mechanism is donor-acceptor recombination-type light emission which utilizes a donor level and an acceptor level. A thin-film-type inorganic EL element has a structure where a light-emitting layer is sandwiched between dielectric layers, which are further sandwiched between electrodes, and its light emission mechanism is localized-type light emission that utilizes inner-shell electron transition of metal ions. Note that, here, description is made using an organic EL element as a light-emitting element.

Structures of the light-emitting element are described with reference to FIGS. 11A to 11C. Here, a cross-sectional structure of a pixel is described by taking an n-channel driving TFT as an example. TFTs 701, 711, and 721 used for semiconductor devices illustrated in FIGS. 11A to 11C can be manufactured in a manner similar to that of the transistors described in the previous embodiments.

In order to extract light from a light-emitting element, at least one of the anode and the cathode is transparent. Here, transparent means that at least an emission wavelength has sufficiently high transmittance. As a method for extracting light, a thin film transistor and a light emitting element are formed over a substrate; and there are a top emission method (a top extraction method) by which light is extracted from a side opposite to the substrate, a bottom emission method (a bottom extraction method) by which light is extracted from the substrate side, a dual emission method (a dual extraction method) by which light is extracted from both the substrate side and the side opposite to the substrate, and the like.

A top-emission-type light-emitting element is described with reference to FIG. 11A.

Figure 11A:
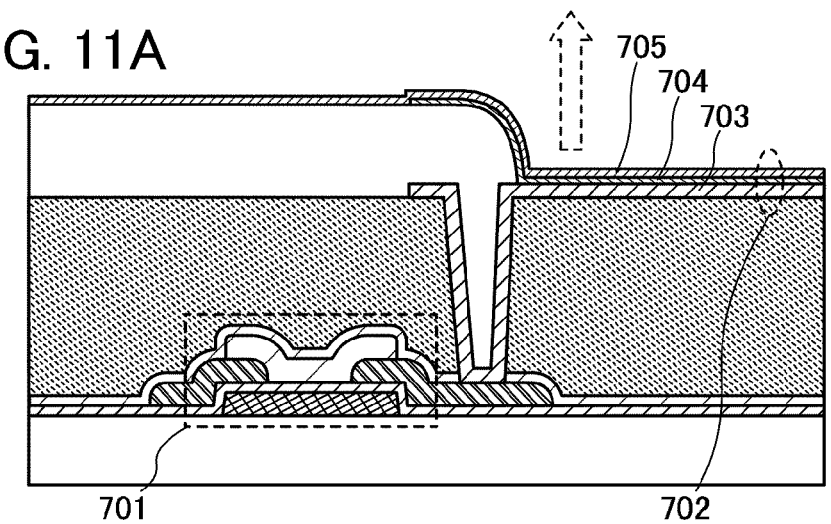
FIGS. 11A to 11C are drawings each illustrating a semiconductor device.

FIG. 11A is a cross-sectional view of a pixel in the case where light is emitted from a light-emitting element 702 to an anode 705 side. Here, a cathode 703 of the light-emitting element 702 and the TFT 701 which is a driving TFT are electrically connected to each other, and a light-emitting layer 704 and the anode 705 are stacked in this order over the cathode 703. As the cathode 703, a conductive film which has a low work function and reflects light can be used. For example, a material such as Ca, Al, MgAg, or AlLi is preferably used to form the cathode 703. The light-emitting layer 704 may be formed using either a single layer or a plurality of layers stacked. When the light-emitting layer 704 is formed using a plurality of layers, an electron-injecting layer, an electron-transporting layer, a light-emitting layer, a hole-transporting layer, and a hole-injecting layer are preferably stacked in this order over the cathode 703; however, needless to say, it is not necessary to form all of these layers. The anode 705 is formed using a light-transmitting conductive material. For example, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added may be used.

A structure in which the light-emitting layer 704 is sandwiched between the cathode 703 and the anode 705 can be called the light-emitting element 702. In the case of the pixel illustrated in FIG. 11A, light is emitted from the light-emitting element 702 to the anode 705 side as indicated by an arrow.

Next, a bottom-emission-type light-emitting element is described with reference to FIG. 11B.

Figure 11B:
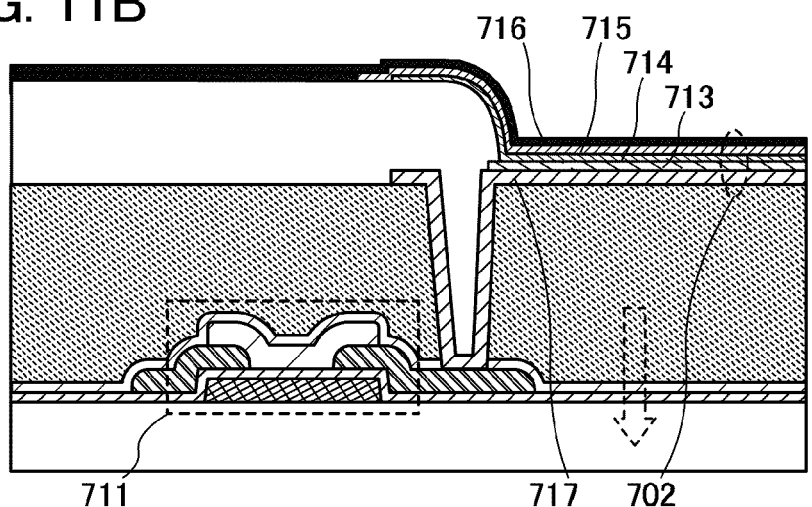

FIG. 11B is a cross-sectional view of a pixel in the case where light is emitted from a light-emitting element 712 to a cathode 713 side. Here, the cathode 713 of the light-emitting element 712 is formed over a light-transmitting conductive film 717 which is electrically connected to the driving TFT 711, and a light-emitting layer 714 and an anode 715 are stacked in this order over the cathode 713. Note that a light-blocking film 716 may be formed so as to cover the anode 715 when the anode 715 has a light-transmitting property. For the cathode 713, a conductive material having a low work function can be used like in the case of FIG. 11A. Note that the cathode 713 is formed to a thickness that can transmit light (preferably, approximately 5 nm to 30 nm). For example, an aluminum film with a thickness of approximately 20 nm can be used as the cathode 713. Similarly to the case of FIG. 11A, the light-emitting layer 714 may be formed using either a single layer or a plurality of layers stacked. Similarly to the case of FIG. 11A, the anode 715 is not required to transmit light, but may be made of a light-transmitting conductive material. As the light-blocking film 716, a metal which reflects light or the like can be used; however, it is not limited thereto. For example, a resin to which black pigments are added or the like can also be used.

A structure in which the light-emitting layer 714 is sandwiched between the cathode 713 and the anode 715 can be called the light-emitting element 712. In the case of the pixel illustrated in FIG. 11B, light is emitted from the light-emitting element 712 to the cathode 713 side as indicated by an arrow.

Next, a dual-emission-type light-emitting element having a dual emission method is described with reference to FIG. 11C.

Figure 11C:
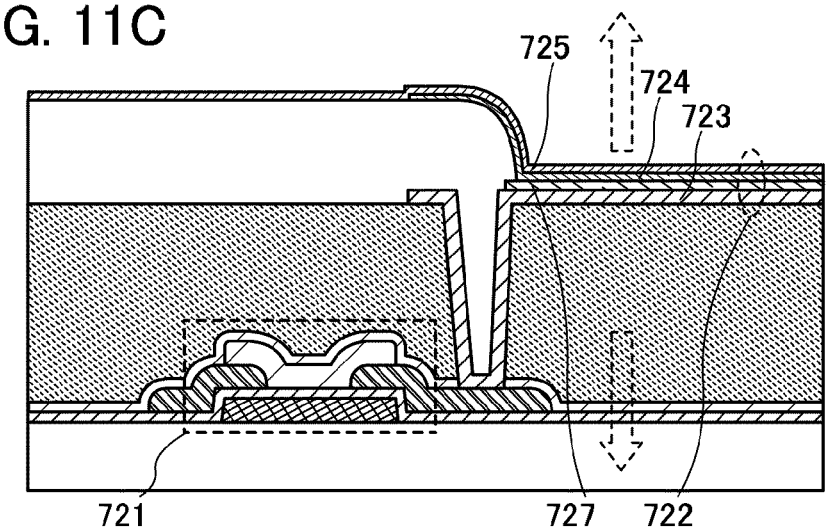

In FIG. 11C, a cathode 723 of a light-emitting element 722 is formed over a light-transmitting conductive film 727 which is electrically connected to the driving TFT 721, and a light-emitting layer 724 and an anode 725 are stacked in this order over the cathode 723. For the cathode 723, a conductive material having a low work function can be used like in the case of FIG. 11A. Note that the cathode 723 is formed to a thickness that can transmit light. For example, an Al film with a thickness of approximately 20 nm can be used as the cathode 723. Similarly to the case of FIG. 11A, the light-emitting layer 724 may be formed using either a single layer or a plurality of layers stacked. Similarly to the case of FIG. 11A, the anode 725 can be formed using a light-transmitting conductive material.

A structure where the cathode 723, the light-emitting layer 724, and the anode 725 overlap with one another can be called the light-emitting element 722. In the case of the pixel illustrated in FIG. 11C, light is emitted from the light-emitting element 722 to both the anode 725 side and the cathode 723 side as indicated by arrows.

Although a case of using an organic EL element as a light-emitting element is described here, an inorganic EL element can also be used as a light-emitting element. The example is described here in which a thin film transistor (a driving TFT) which controls the driving of a light-emitting element is electrically connected to the light-emitting element; however, a TFT for current control or the like may be connected between the driving TFT and the light-emitting element.

Note that the structure of the semiconductor device described in this embodiment is not limited to those illustrated in FIGS. 11A to 11C and can be modified in various ways.

Next, the appearance and a cross section of a light-emitting display panel (also referred to as a light-emitting panel) are described with reference to FIGS. 12A and 12B. FIGS. 12A and 12B are a plan view and a cross-sectional view of a panel in which thin film transistors 4509 and 4510 and a light-emitting element 4511 which are formed over a first substrate 4501 are sealed by a second substrate 4506 and a sealant 4505. FIG. 12A is a plan view and FIG. 12B is a cross-sectional view taken along the line H-I in FIG. 12A.

The sealant 4505 is provided to so as to surround a pixel portion 4502, signal line driver circuits 4503a and 4503b, and scanning line driver circuits 4504a and 4504b, which are provided over the first substrate 4501. In addition, the second substrate 4506 is provided over the pixel portion 4502, the signal line driver circuits 4503a and 4503b, and the scanning line driver circuits 4504a and 4504b. In other words, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. Packaging (sealing) is preferably performed using a protective film (such as a bonding film or an ultraviolet curable resin film), a cover material, or the like with high air-tightness and little degasification.

The pixel portion 4502, the signal line driver circuits 4503a and 4503b, and the scanning line driver circuits 4504a and 4504b, which are formed over the first substrate 4501, each include a plurality of thin film transistors, and a thin film transistor 4510 included in the pixel portion 4502 and a thin film transistor 4509 included in the signal line driver circuit 4503a are illustrated as an example in FIG. 12B.

As the thin film transistors 4509 and 4510, the transistors described in the previous embodiments can be employed. Note that in this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. In the structure of the light-emitting element 4511, the first electrode layer 4517, an electroluminescent layer 4512, and a second electrode layer 4513 are stacked; however, it is not limited to the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating film, organic polysiloxane, or the like. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed using either a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals are supplied to the signal line driver circuits 4503a and 4503b, the scanning line driver circuits 4504a and 4504b, the pixel portion 4502, or the like from FPCs 4518a and 4518b.

In this embodiment, an example is described where a connection terminal electrode 4515 is formed from the same conductive film as the first electrode layer 4517 of the light-emitting element 4511, and a terminal electrode 4516 is formed from the same conductive film as the source and drain electrode layers of the thin film transistors 4509 and 4510.

The connection terminal electrode 4515 is electrically connected to a terminal of the FPC 4518a through an anisotropic conductive film 4519.

The substrate located in the direction in which light is extracted from the light-emitting element 4511 needs to have a light-transmitting property. As a substrate having a light-transmitting property, a glass plate, a plastic plate, a polyester film, an acrylic film, and the like are given.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. In this embodiment, an example where nitrogen is used for the filler is described.

If needed, an optical film, such as a polarizing plate, a circularly polarizing plate (including an elliptically polarizing plate), a retardation plate (a quarter-wave plate or a half-wave plate), or a color filter, may be provided on a light-emitting surface of the light-emitting element. Furthermore, an antireflection treatment may be performed on a surface thereof. For example, anti-glare treatment by which reflected light can be diffused by projections and depressions on the surface so as to reduce the glare can be performed.

The signal line driver circuits 4503a and 4503b and the scanning line driver circuits 4504a and 4504b may be formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 12A and 12B.

Through the above steps, a high-performance light-emitting display device (display panel) can be manufactured. Note that this embodiment can be implemented in combination with any of the previous embodiments as appropriate.

Embodiment 7

A semiconductor device can be applied to electronic paper. Electronic paper can be used for electronic appliances of a variety of fields as long as they can display data. For example, electronic paper can be applied to an e-book reader (electronic book), a poster, an advertisement in a vehicle such as a train, displays of various cards such as a credit card, or the like. Examples of the electronic appliances are illustrated in FIGS. 13A and 13B and FIG. 14.

Figure 13A:
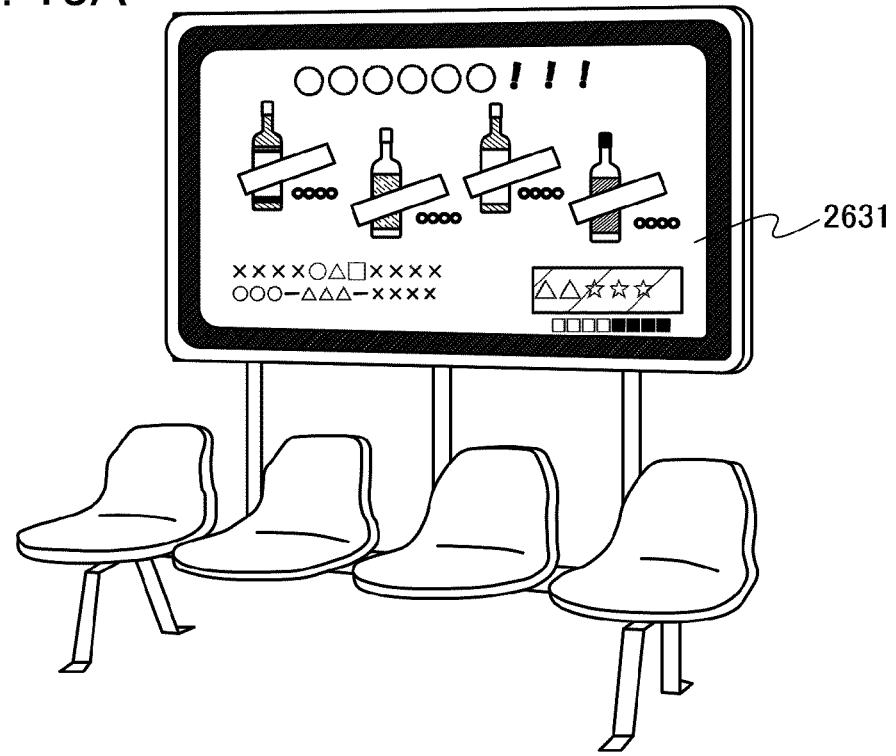
FIGS. 13A and 13B are views illustrating examples of a usage pattern of electronic paper.

FIG. 13A illustrates a poster 2631 using electronic paper. In the case where an advertising medium is printed paper, the advertisement is replaced by hands; however, by using electronic paper, the advertising display can be changed in a short time. Furthermore, stable images can be obtained without display defects. Note that the poster may have a configuration capable of wirelessly transmitting and receiving data.

Figure 13B:
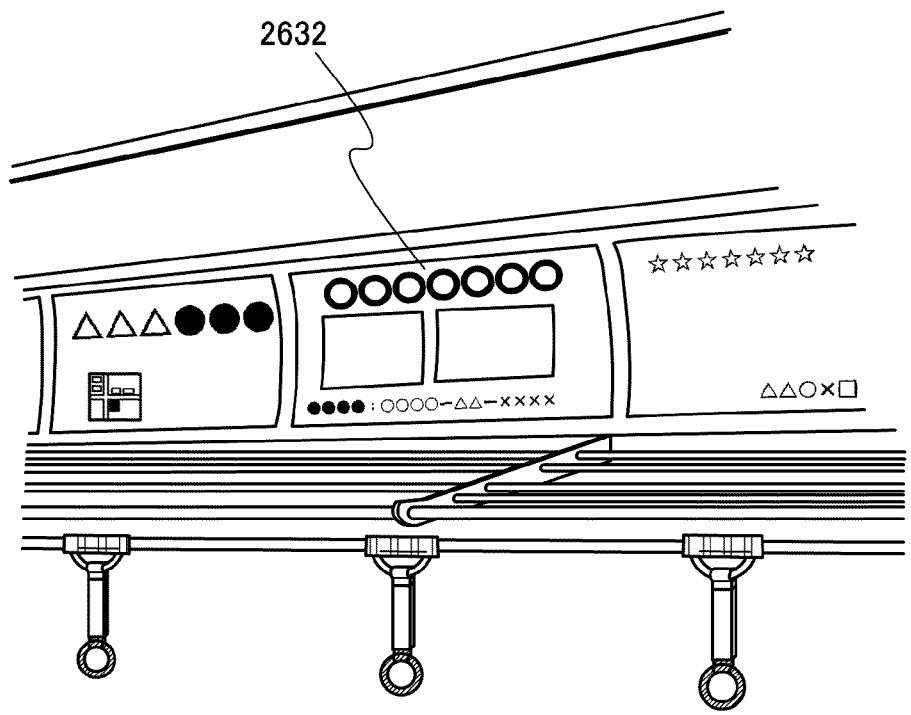

FIG. 13B illustrates an advertisement 2632 in a vehicle such as a train. In the case where an advertising medium is printed paper, the advertisement is replaced by hands; however, by using electronic paper, the advertising display can be changed in a short time with less manpower. Furthermore, stable images can be obtained without display defects. Note that the advertisement may have a configuration capable of wirelessly transmitting and receiving data.

Figure 14:
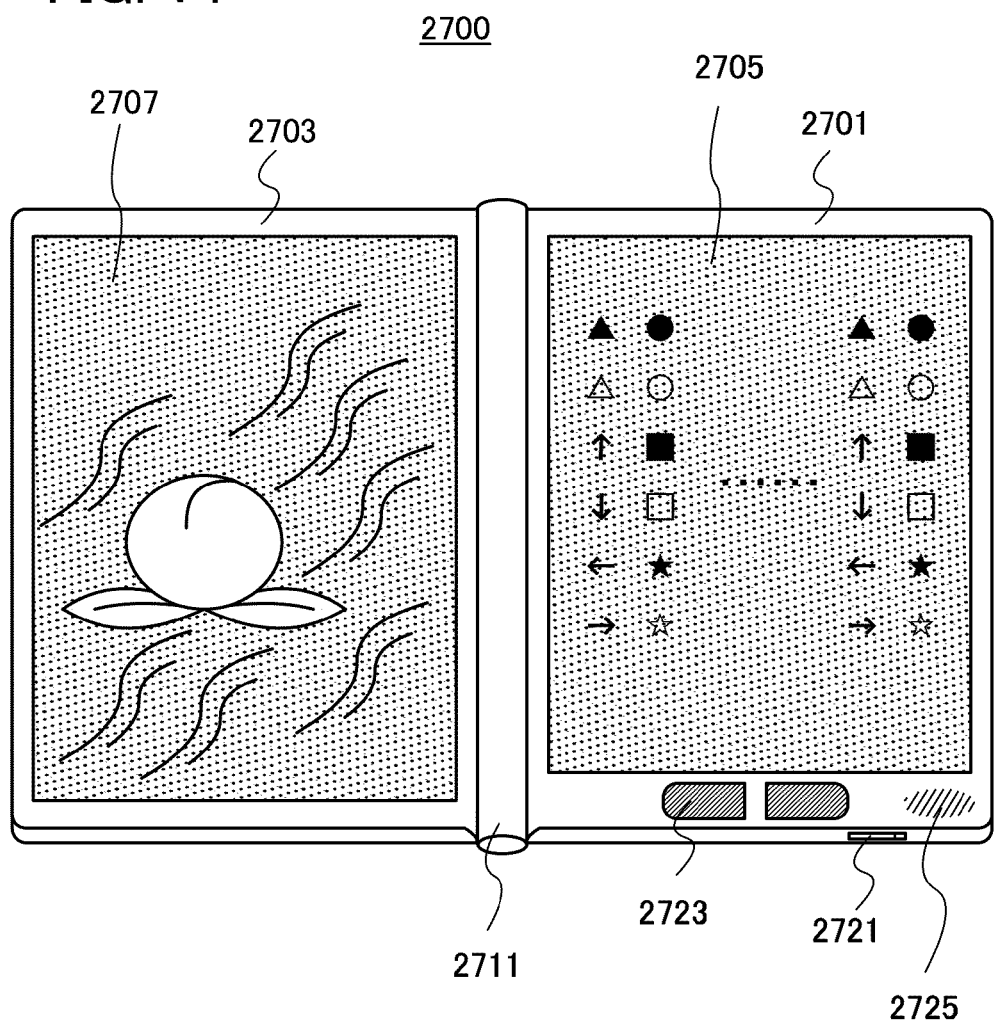
FIG. 14 is an external view of one example of an electronic book reader.

FIG. 14 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 14) and graphics can be displayed on a display portion on the left side (the display portion 2707 in FIG. 14).

FIG. 14 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to an AC adapter and various cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that this embodiment can be implemented in combination with any of the previous embodiments as appropriate.

Embodiment 8

A semiconductor device can be applied to a variety of electronic appliances (including amusement machines). Examples of electronic appliances include television sets (also referred to as televisions or television receivers), monitor of computers or the like, digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 15A:
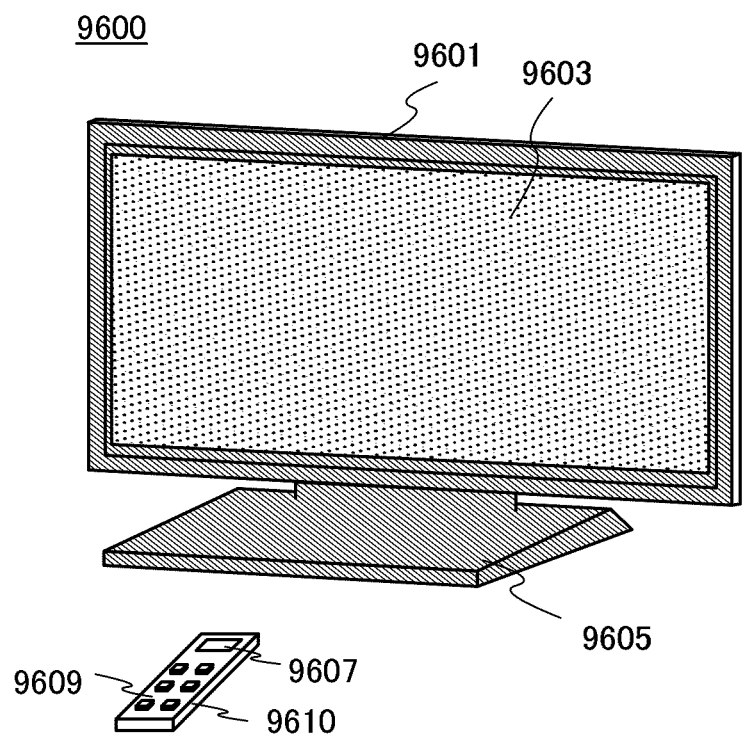
FIG. 15A is an external view of an example of a television device and FIG. 15B is an external view of an example of a digital photo frame.

FIG. 15A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 15B:
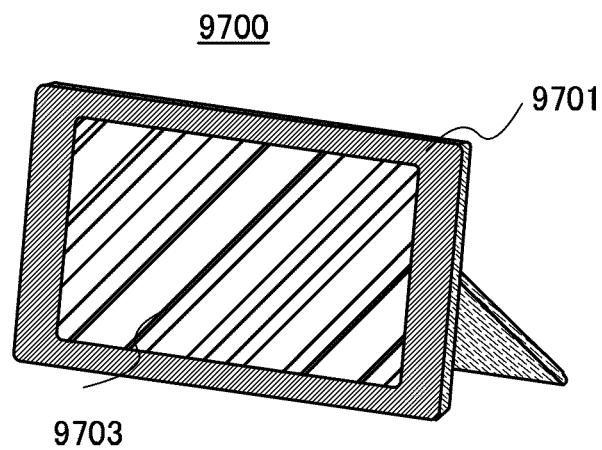

FIG. 15B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may be configured to transmit and receive data wirelessly. The structure may be employed in which desired image data is transferred wirelessly to be displayed.

Figure 16A:
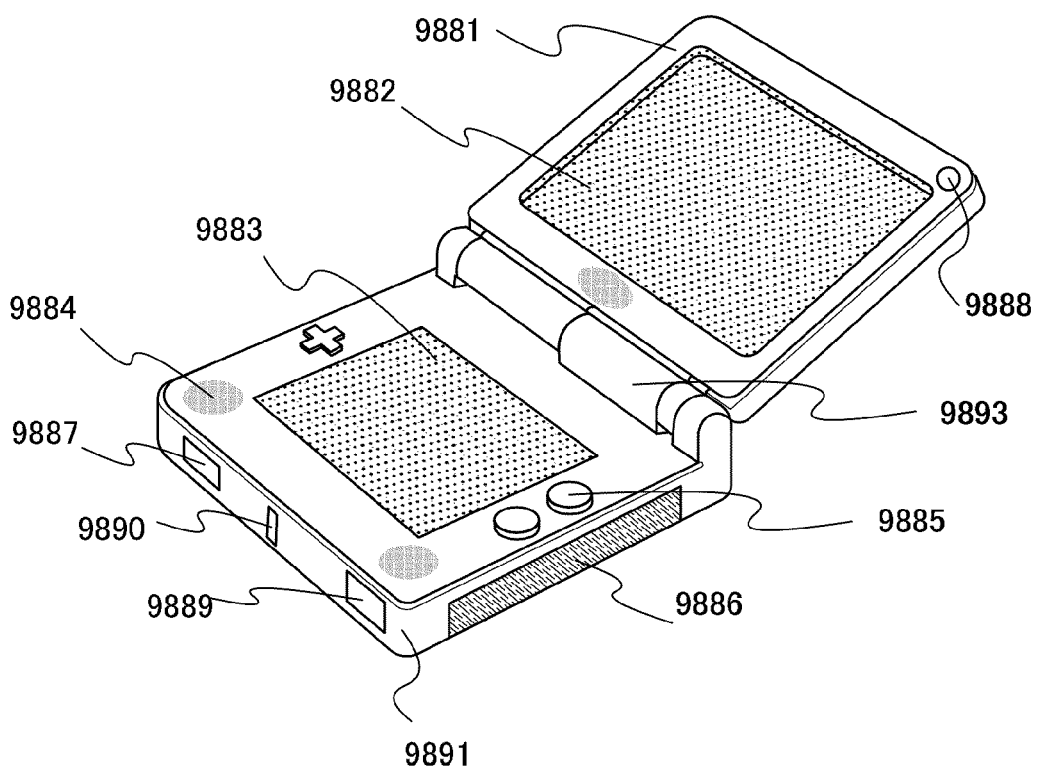
FIGS. 16A and 16B are external views showing examples of an amusement machine.

FIG. 16A is a portable amusement machine and includes two housings, a housing 9881 and a housing 9891, which are connected with a joint portion 9893 so that the portable amusement machine can be opened or folded. A display portion 9882 and a display portion 9883 are incorporated in the housing 9881 and the housing 9891, respectively. In addition, the portable amusement machine illustrated in FIG. 16A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device may be employed. The portable amusement machine may include other accessory equipment, as appropriate. The portable amusement machine illustrated in FIG. 16A has a function of reading a program or data stored in a recording medium to display it on the display portion, and a function of sharing information with another portable amusement machine by wireless communication. Note that the portable amusement machine illustrated in FIG. 16A can have various functions without limitation to the above.

Figure 16B:
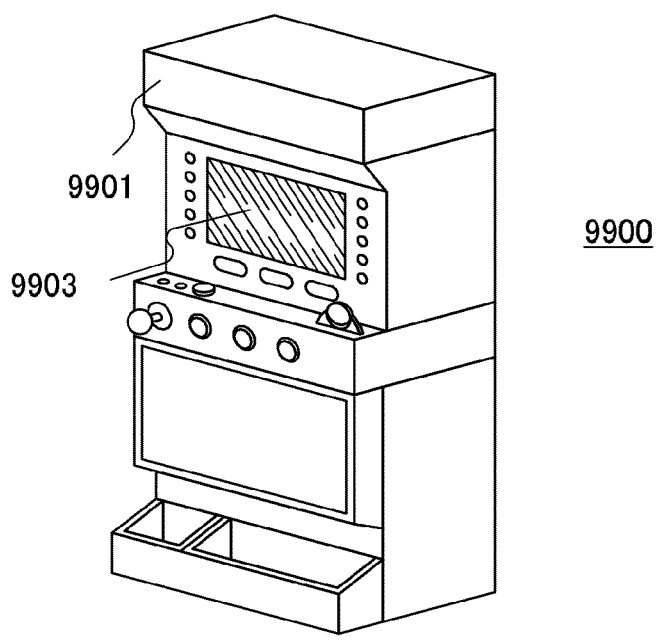

FIG. 16B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device may be employed. The slot machine 9900 may include other accessory equipment, as appropriate.

Figure 17A:
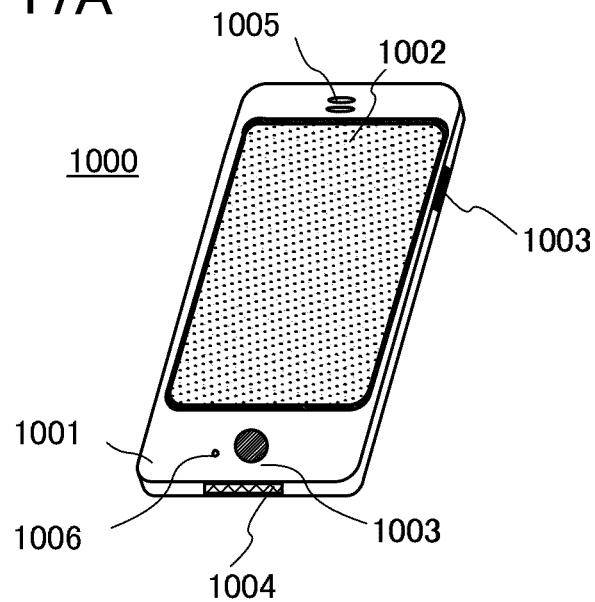
FIGS. 17A and 17B are external views illustrating examples of a cellular phone.

FIG. 17A illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 17A is touched with a finger or the like, data can be input into the cellular phone 1000. Furthermore, making calls, composing mails or the like can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002, or operating the operation buttons 1003 of the housing 1001. Alternatively, the screen mode can be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 can function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 17B:
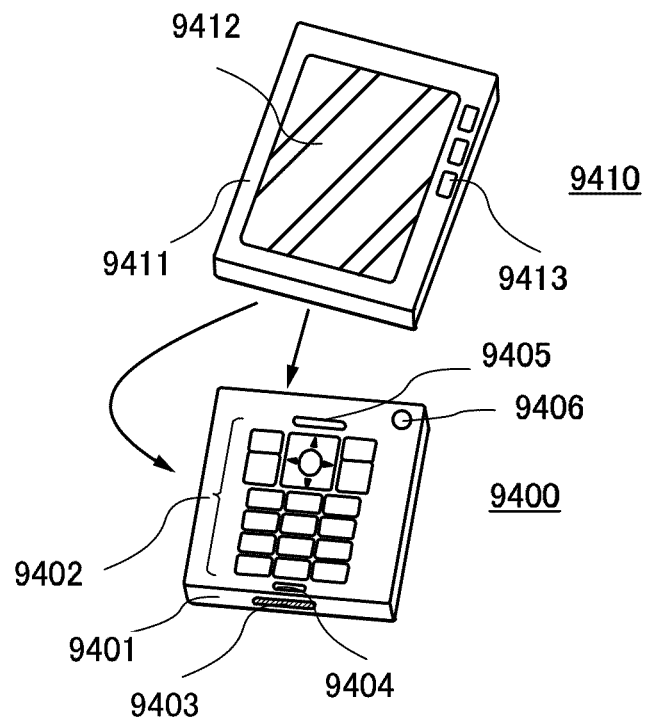

FIG. 17B also illustrates an example of a mobile phone. The cellular phone in FIG. 17B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function by moving in two directions indicated by the arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that this embodiment can be implemented in combination with any of the previous embodiments as appropriate.

Example 1

In this example, effectiveness of a case where both the first heat treatment and the second heat treatment are performed, which is one embodiment of the disclosed invention, was checked. Hereinafter, description is made with reference to drawings.

In this example, a transistor which was manufactured by the method according to Embodiment 1 was used as a sample. In other words, the sample used here was subjected to the following heat treatment: heat treatment (the first heat treatment) at 350° C. for one hour in an air atmosphere, which was performed after a conductive layer functioning as a source electrode or a drain electrode was formed; and heat treatment (the second heat treatment) at 350° C. for one hour in an air atmosphere, which was performed after a conductive layer functioning as a pixel electrode or the like was formed. For a semiconductor layer of the transistor, an oxide semiconductor material containing indium, gallium, and zinc was used. The channel length of the transistor was 100 μm and the channel width thereof was 100 μm. Measured by a secondary ion mass spectroscopy (SIMS), the hydrogen concentration in the semiconductor layer after the second heat treatment was $8.0 \times 10^{20}$ atoms/cm$^3$ to $1.0 \times 10^{21}$ atoms/cm$^3$ and the nitrogen concentration was $1.0 \times 10^{19}$ atoms/cm$^3$ to $1.5 \times 10^{19}$ atoms/cm$^3$ (see FIG. 18). Note that there was not a large difference between the hydrogen concentration and nitrogen concentration in the semiconductor layer before the heat treatment and those after the heat treatment.

A silicon oxide film which was formed by a sputtering method (an RF sputtering method) was used as an insulating layer functioning as an interlayer insulating layer. In more specific, two kinds of interlayer insulating layers were formed using $SiO_2$ as a target. The manufacturing conditions of Sample 1 were as follows: the substrate temperature was set at 100° C.; the flow rate of argon, 40 sccm; and the flow rate of oxygen, 10 sccm. The manufacturing conditions of Sample 2 were as follows: the substrate temperature was set at 100° C.; the flow rate of argon, 25 sccm; and the flow rate of oxygen, 25 sccm. In addition to the above conditions, the insulating layers were formed with a pressure kept at 0.4 Pa in a chamber and a film formation rate of 8.7 nm/min. Measured by a secondary ion mass spectroscopy, the hydrogen concentration in the insulating layers after the second heat treatment was $2.5 \times 10^{20}$ atoms/cm$^3$ to $3.0 \times 10^{20}$ atoms/cm$^3$ and the nitrogen concentration was $6.0 \times 10^{17}$ atoms/cm$^3$ to $7.0 \times 10^{17}$ atoms/cm$^3$ (see FIG. 18). Note that there was not a large difference between the hydrogen concentration and nitrogen concentration in the insulating layer before the heat treatment and those after the heat treatment.

Figures 18, 19:
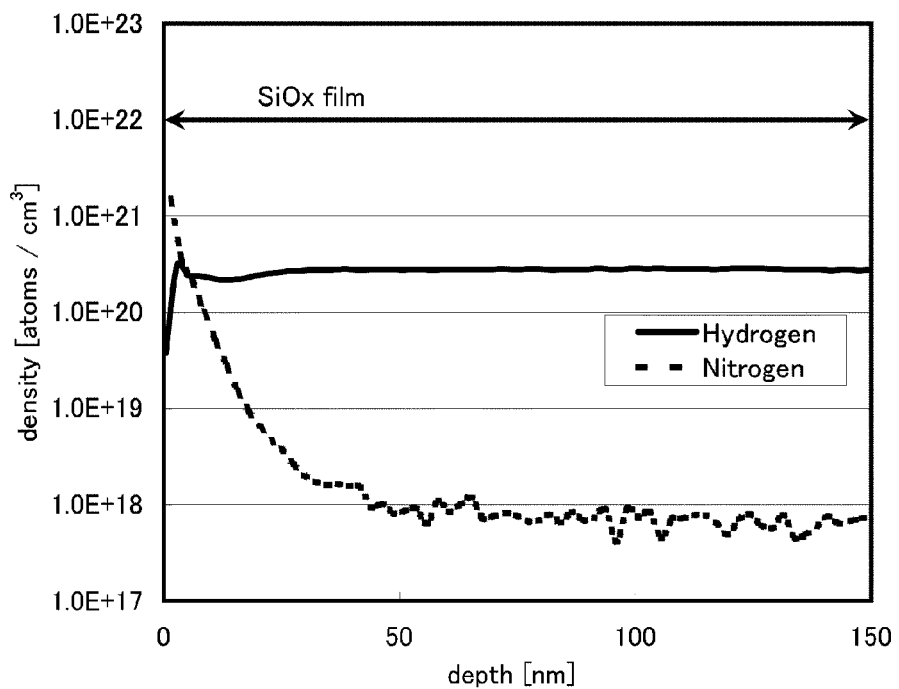
FIG. 18 is a table showing the hydrogen concentration and the nitrogen concentration in a semiconductor layer and an insulating layer.
FIG. 19 is a graph showing analysis results of the hydrogen concentration and the nitrogen concentration in the insulating layer.

Note that in FIG. 19 the profile of the hydrogen concentration and nitrogen concentration in the insulating layer (Sample 1) which were measured by a secondary ion mass spectroscopy is shown. In FIG. 19, the horizontal axis shows the depth (nm) while the vertical axis shows the density (atoms/cm$^3$). Further, the solid line in FIG. 19 shows the profile of the hydrogen concentration and the dotted line shows the profile of the nitrogen concentration.

Figure 20A:
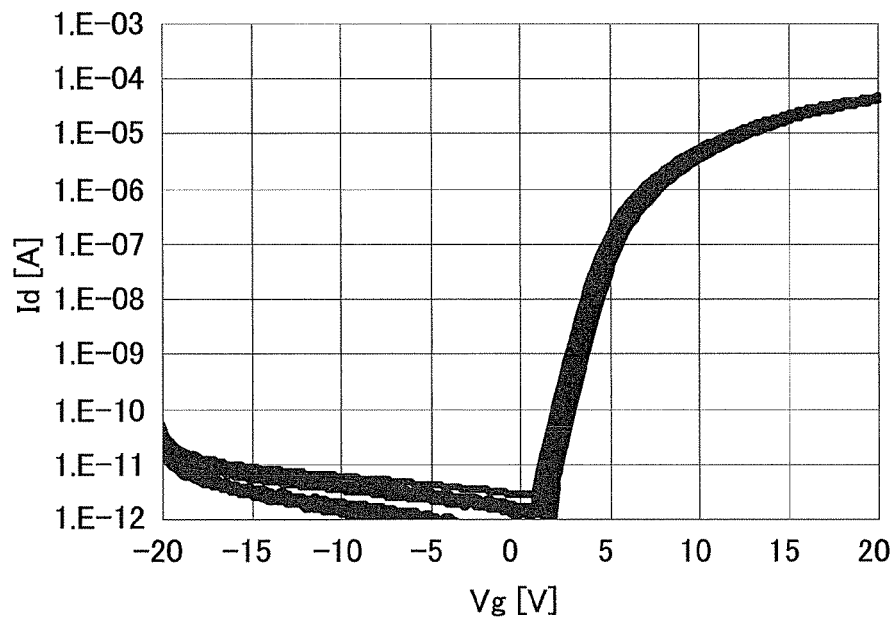
FIGS. 20A and 20B are graphs showing current vs. voltage characteristics of a transistor.
Figure 20B:
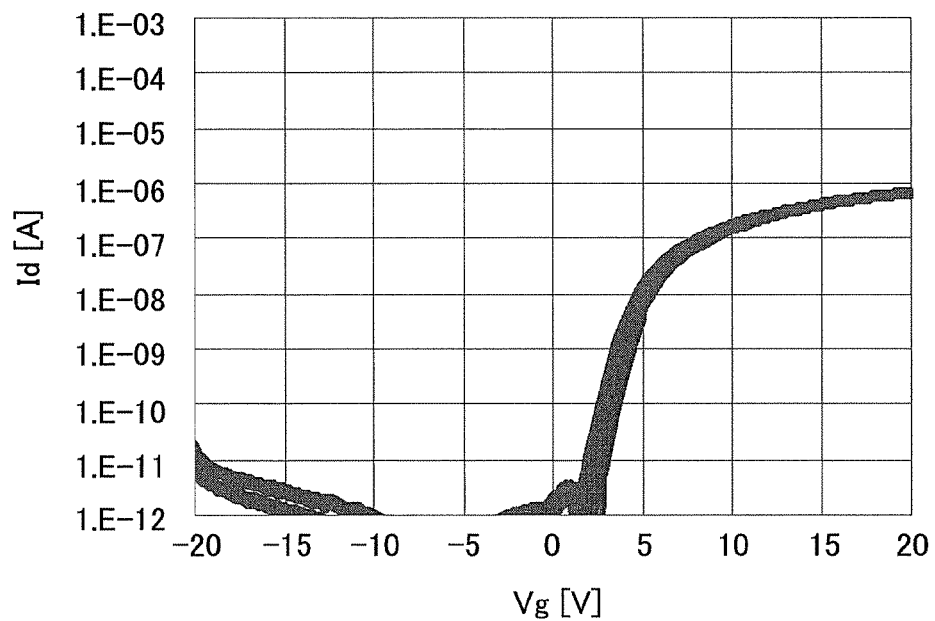

The current vs. voltage characteristics of the above-described transistor is shown in FIGS. 20A and 20B. The horizontal axis shows the gate voltage ($V_g$) and the vertical axis shows the drain current ($I_d$). Here, the current vs. voltage characteristics when the drain voltage ($V_d$) was 10 V is shown in FIG. 20A. The current vs. voltage characteristics when the drain voltage ($V_d$) was 0.1 V is shown in FIG. 20B. There is not a large variation between the current vs. voltage characteristics in FIG. 20A and those in FIG. 20B. From this, it is apparent that a transistor with favorable characteristics can be obtained in the case where both the first heat treatment and the second heat treatment are performed.

Figure 21A:
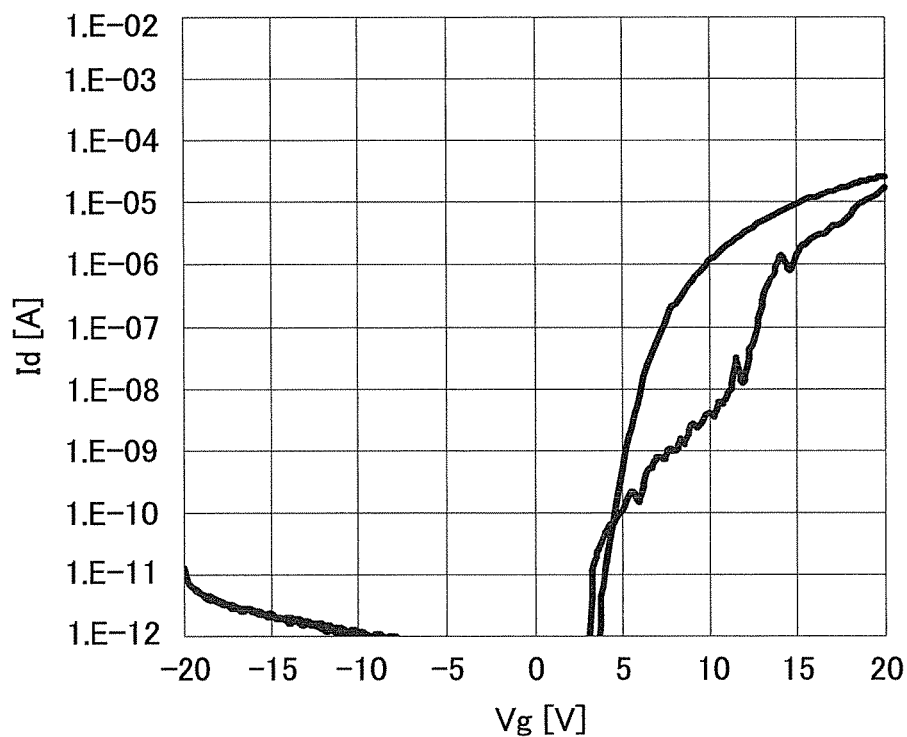
FIGS. 21A and 21B are graphs showing current vs. voltage characteristics of a transistor.
Figure 21B:
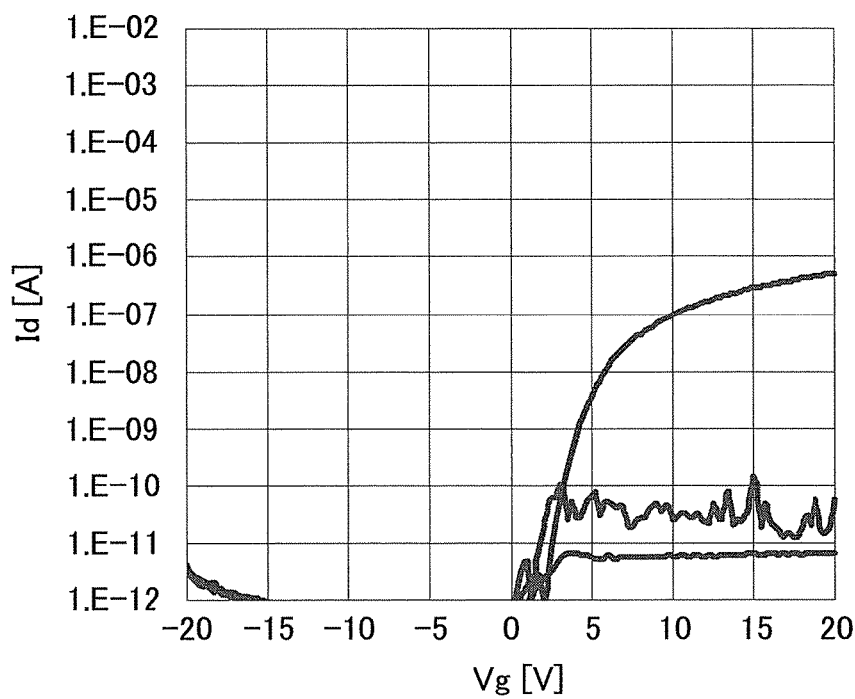
Figure 22A:
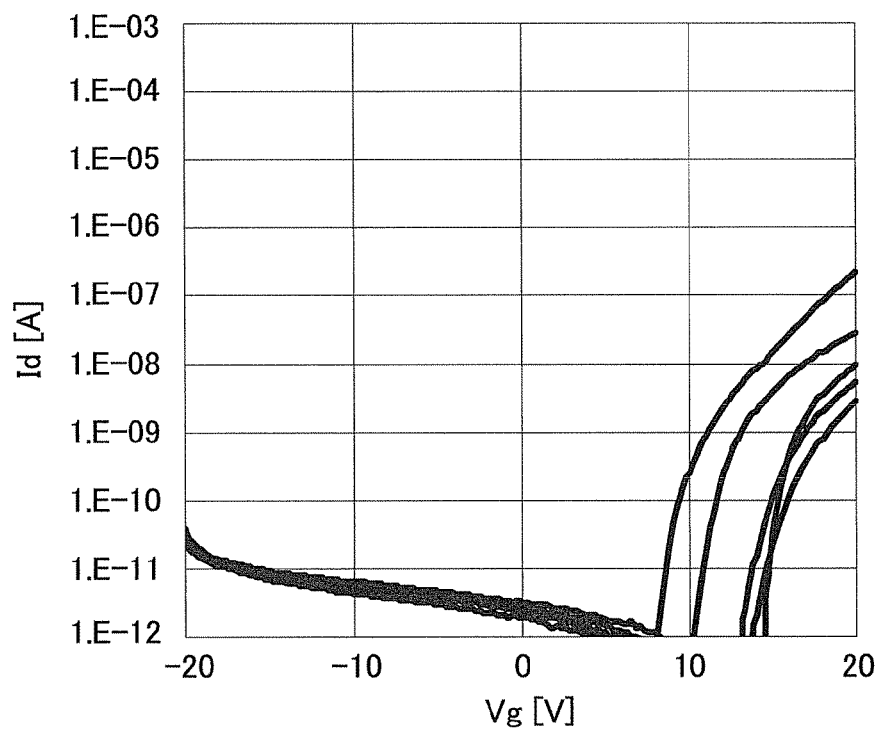
FIGS. 22A and 22B are graphs showing current vs. voltage characteristics of a transistor.
Figure 22B:
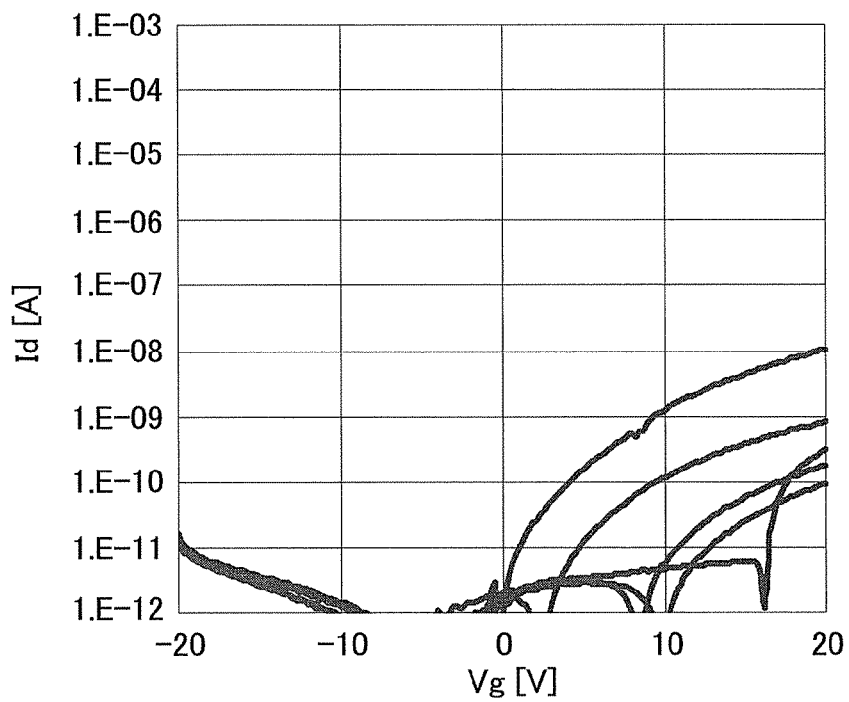

For comparison, a similar measurement was performed on samples whose manufacturing processes vary only in the heat treatment process. FIGS. 21A and 21B show the current vs. voltage characteristics of a transistor in the case where the first heat treatment was performed and the second heat treatment was not performed. FIGS. 22A and 22B show the current vs. voltage characteristics of a transistor in the case where the second heat treatment was performed and the first heat treatment was not performed. In each of FIGS. 21A and 21B, and FIGS. 22A and 22B, the horizontal axis shows the gate voltage ($V_g$) and the vertical axis shows the drain current ($I_d$). Note that FIG. 21A and FIG. 22A each show the current vs. voltage characteristics when the drain voltage ($V_d$) was 10 V. FIG. 21B and FIG. 22B each show the current vs. voltage characteristics when the drain voltage ($V_d$) was 0.1 V.

It is apparent from FIGS. 21A and 21B, and FIGS. 22A and 22B, sufficient characteristics cannot be obtained when only one of the first heat treatment and the second treatment is performed. In addition, variations in the characteristics are extremely large. According to comparison between FIGS. 20A and 20B, and FIGS. 21A and 21B or FIGS. 22A and 22B, it is apparent that the transistor characteristics are dramatically improved and the variation in characteristics is reduced in the case of performing both the first heat treatment and the second heat treatment.

For comparison, an insulating layer whose hydrogen concentration and nitrogen concentration were high was formed by a CVD method and the current vs. voltage characteristics of a transistor using the insulating layer was examined in the same way. As a result of this examination, it was found that the best characteristics was obtained in the case where the first heat treatment was not performed and the second heat treatment was performed. In this case, the hydrogen concentration in the semiconductor layer was $1.0 \times 10^{21}$ atoms/cm$^3$ and the nitrogen concentration in the semiconductor layer was $1.5 \times 10^{19}$ atoms/cm$^3$ to $2.0 \times 10^{19}$ atoms/cm$^3$. The hydrogen concentration in the insulating layer was $2.0 \times 10^{21}$ atoms/cm$^3$ and the nitrogen concentration in the insulating layer was $6.0 \times 10^{20}$ atoms/cm$^3$ to $1.5 \times 10^{21}$ atoms/cm$^3$.

From this, it is understood that it is extremely effective to perform both the first heat treatment and the second heat treatment in the case where the hydrogen concentration in the insulating layer is lower than the hydrogen concentration in the semiconductor layer, or in the case where the nitrogen concentration in the insulating layer is lower than the nitrogen concentration in the semiconductor layer.

Example 2

In this example, the result of an examination on characteristics of transistors which were manufactured under conditions varying from those of Embodiment 1 is shown.

<Flow Rate of Oxygen for Forming Interlayer Insulating Layer>

The flow rate of oxygen for forming an interlayer insulating layer was investigated. All conditions (parameters, film formation conditions, and the like of the interlayer insulating layer) except for the flow rate for forming the interlayer insulating layer were not varied. Specifically, as the interlayer insulating layer, a silicon oxide film with a thickness of 300 nm which was formed by a sputtering method (an RF sputtering method) using $SiO_2$ as a target was used. The investigation was conducted under the following three conditions: the flow rate of argon was 40 sccm and the flow rate of oxygen was 10 sccm in the deposition atmosphere (Condition 1); the flow rate of argon was 30 sccm and the flow rate of oxygen was 20 sccm in the deposition atmosphere (Condition 2); and the flow rate of argon was 20 sccm and the flow rate of oxygen was 30 sccm in the deposition atmosphere (Condition 3). Note that substrate temperature was 100° C. and pressure in a chamber was 0.4 Pa at the time of film deposition.

Parameters of a transistor and other conditions by which the transistor was manufactured were the same as those of Embodiment 1. That is, heat treatment (the first heat treatment) was performed at 350° C. for one hour in an air atmosphere after a conductive layer functioning as a source electrode or a drain electrode was formed; and heat treatment (the second heat treatment) was performed at 350° C. for one hour in an air atmosphere after a conductive layer functioning as a pixel electrode or the like was formed. Further, for a semiconductor layer of the transistor, an oxide semiconductor material containing indium, gallium, and zinc was used. The channel length of the transistor was 20 μm and the channel width thereof was 20 μm.

Figure 23:
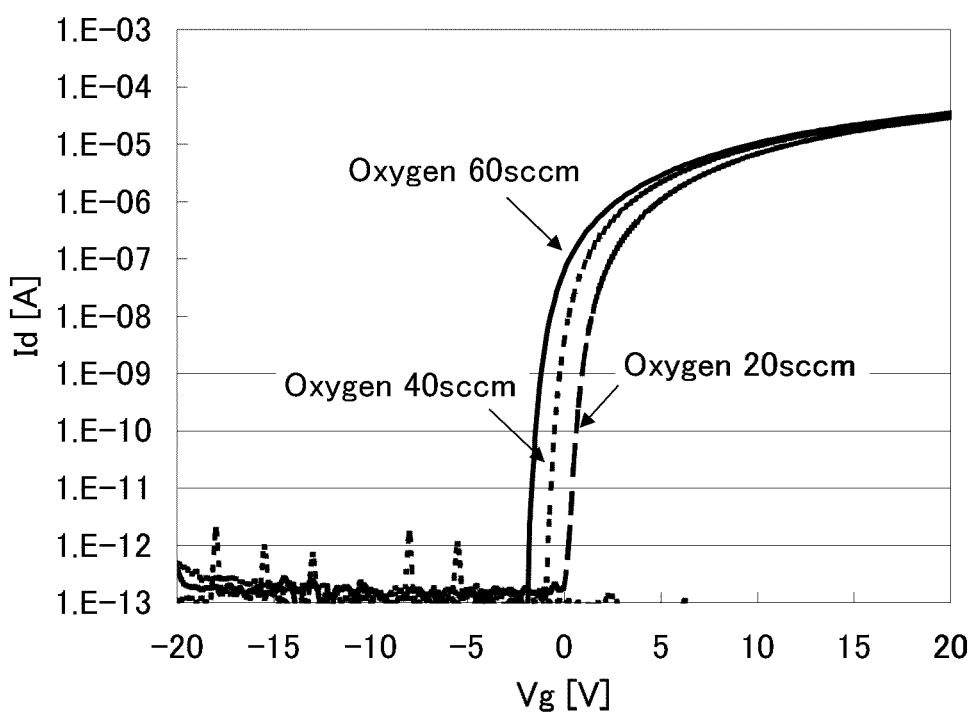
FIG. 23 is a graph showing current vs. voltage characteristics of transistors.

In FIG. 23, the gate voltage ($V_g$) vs. drain current ($I_d$) characteristics of the transistors which were manufactured under the above-described three conditions are shown. From comparison between the transistors which were manufactured under the three conditions, it is apparent that a normally-off transistor becomes likely to be obtained as the flow rate of oxygen becomes lower. It is favorable that the flow rate ratio of oxygen to the sum of the flow rate of argon and the flow rate of oxygen is 0.5 (also represented as <Ar+$O_2$>:$O_2$=1:0.5) or less so as to realize a normally-off transistor.

<Pressure for Forming Interlayer Insulating Layer>

Next, pressure for forming an insulating layer which functions as an interlayer insulating layer was investigated. All conditions (parameters, film formation conditions, and the like of the interlayer insulating layer) except for the pressure for forming the interlayer insulating layer were not varied. Specifically, a silicon oxide film with a thickness of 300 nm which was formed by a sputtering method (an RF sputtering method) using $SiO_2$ as a target was used. The investigation was conducted under four conditions where the pressure in the chamber was set at 0.2 Pa, 0.4 Pa, 0.8 Pa, and 1.6 Pa, as the flow rate ratio of argon and oxygen was made constant (Ar:$O_2$=4:1). Note that substrate temperature was 100° C. at the time of film deposition.

Parameters of a transistor and other conditions by which the transistor was manufactured were the same as those shown in <Flow Rate of Oxygen for Forming Interlayer Insulating Layer> and therefore are omitted here.

Figure 24:
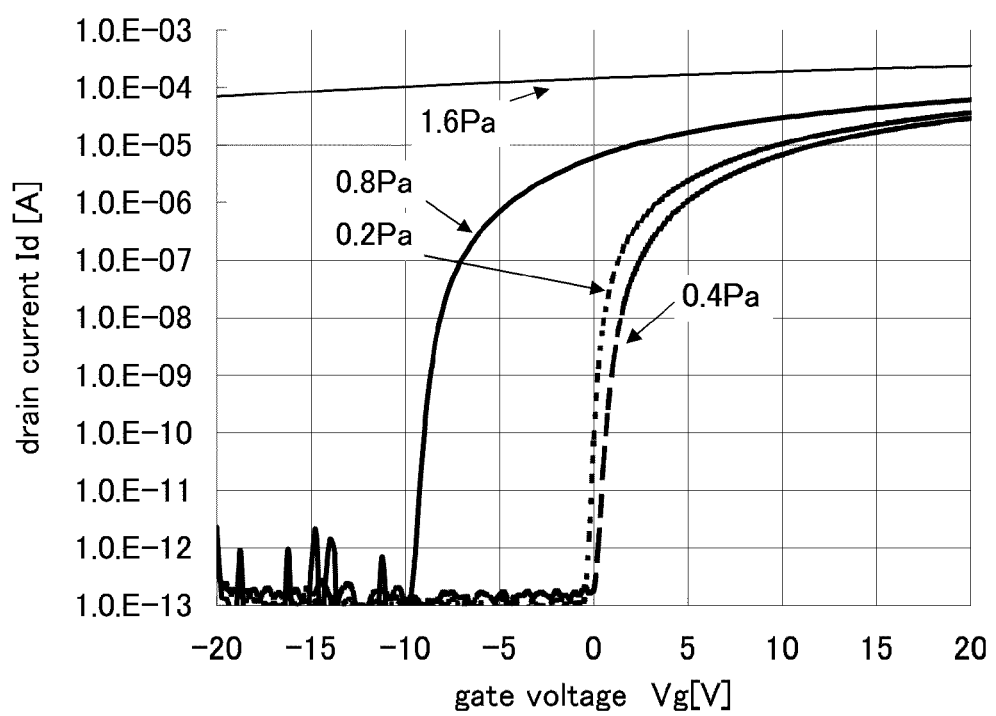
FIG. 24 is a graph showing current vs. voltage characteristics of transistors.

In FIG. 24, the gate voltage ($V_g$) vs. drain current ($I_d$) characteristics of the transistors which were manufactured under the above-described four conditions are shown. From comparison between the transistors which were manufactured under the four conditions, it is apparent that the rising tends to become sharp (S value tends to be reduced) as the pressure becomes lower. It is favorable that the pressure at the time of deposition be 0.6 Pa or lower so as to obtain S value which is sufficient small.

<Substrate Temperature for Forming Interlayer Insulating Layer>

Substrate temperature for forming an interlayer insulating layer was investigated. Here, as the interlayer insulating layer, a silicon oxide film with a thickness of 300 nm which was formed by a sputtering method (an RF sputtering method) using $SiO_2$ as a target was used. The conditions by which the interlayer insulating layer was formed were as follows: the pressure in the chamber was 0.4 Pa; and the flow rate of argon was 40 sccm and the flow rate of oxygen was 10 sccm in the deposition atmosphere. The investigation was conducted under three conditions where the substrate temperature at the time of deposition was 100° C., 200° C., and 300° C.

Parameters of a transistor and other conditions by which the transistor was manufactured were the same as those shown in <Flow Rate of Oxygen for Forming Interlayer Insulating Layer> and therefore omitted here.

As a result of examining variations in characteristics between the transistors which are manufactured under the above-described three conditions, it was found that the variation in characteristics tended to become large as the substrate temperature at the time of film deposition became higher. It is favorable that the substrate temperature at the time of film deposition be 200° C. or lower so as to suppress the variation in characteristics.

<Target Used for Forming Interlayer Insulating Layer>

Target used for forming an interlayer insulating layer was investigated. Here, as the interlayer insulating layer, a silicon oxide film with a thickness of 300 nm which was formed by a sputtering method (an RF sputtering method) using $SiO_2$ as a target, or a silicon oxide film with a thickness of 300 nm which was formed by a sputtering method (an RF sputtering method) using Si as a target were used.

Parameters of a transistor and other conditions by which the transistor was manufactured were the same as those shown in <Flow Rate of Oxygen for Forming Interlayer Insulating Layer> and therefore are omitted here.

It was found that in the case of forming the silicon oxide film using Si as a target, the characteristics of the completed transistor was greatly influenced by the flow rate of oxygen at the time of forming the interlayer insulating layer. Moreover, in the case of using Si as a target, an adverse effect of variation in characteristics tended to be increased as compared with the case of using $SiO_2$ as a target. These are thought to result from the following: a principle of advancing the film formation due to a reaction with oxygen in the atmosphere; and a difference in stress between the silicon oxide film and a semiconductor layer (an oxide semiconductor material). It is favorable to use $SiO_2$ as a target so as to control the threshold voltage ($V_{th}$).

<Thickness of Interlayer Insulating Layer>

The thickness of an interlayer insulating layer was investigated. All conditions (parameters, film formation conditions, and the like of the interlayer insulating layer) except for the thickness were not varied. Specifically, like the above description, a silicon oxide film with a thickness of 300 nm which was formed by a sputtering method (an RF sputtering method) using $SiO_2$ as a target was used. There were three conditions where the thickness was 200 nm, 300 nm, and 400 nm.

No significant difference was seen in the characteristics of the transistors when the thickness of the interlayer insulating layer was changed. Therefore, it can be said that the thickness of the interlayer insulating layer may be changed as appropriate.

This application is based on Japanese Patent Application Serial No. 2009-058929 filed with Japan Patent Office on Mar. 12, 2009, and Japanese Patent Application Serial No. 2009-131059 filed with Japan Patent Office on May 29, 2009, the entire contents of which are hereby incorporated by reference.

EXPLANATION OF REFERENCE

100: substrate, 102: conductive layer, 104: resist mask, 106: conductive layer, 108: insulating layer, 110: semiconductor layer, 112: resist mask, 114: semiconductor layer, 116: conductive layer, 118: resist mask, 120: resist mask, 122: conductive layer, 124: conductive layer, 126: insulating layer, 128: conductive layer, 150: transistor, 200: substrate, 202: conductive layer, 204: resist mask, 206: conductive layer, 208: insulating layer, 210: conductive layer, 212: resist mask, 214: resist mask, 216: conductive layer, 218: conductive layer, 220: semiconductor layer, 222: resist mask, 224: semiconductor layer, 226: insulating layer, 228: conductive layer, 250: transistor, 300: substrate, 302: gate electrode, 304: capacitor wiring, 306: terminal, 308: gate insulating layer, 310: source electrode, 312 drain electrode, 314: connection electrode, 316: terminal, 318: semiconductor layer, 320: insulating layer, 322: transparent conductive layer, 324: transparent conductive layer, 326: transparent conductive layer, 350: transistor, 602: substrate, 650: thin film transistor, 660: electrode layer, 670: electrode layer, 680: spherical particle, 682: filler, 701: TFT, 702: light-emitting element, 703: cathode, 704: light-emitting layer, 705: anode, 711: TFT, 712: light-emitting element, 713: cathode, 714: light-emitting layer, 715: anode, 716: light-blocking film, 717: conductive film, 721: TFT, 722: light-emitting element, 723: cathode, 724: light-emitting layer, 725: anode, 727: conductive film, 1000: cellular phone, 1001: housing, 1002: display portion, 1003: operation button, 1004: external connection port, 1005: speaker, 1006: microphone, 2600: TFT substrate, 2601: counter substrate, 2602: sealant, 2603: element layer, 2604: liquid crystal layer, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2631: poster, 2632: advertisement in a vehicle, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scanning line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4033: insulating layer, 4035: spacer, 4501: substrate, 4502: pixel portion, 4503*a*: signal line driver circuit, 4503*b*: signal line driver circuit, 4504*a*: scanning line driver circuit, 4504*b*: scanning line driver circuit, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4518*a*: FPC, 4518*b*: FPC, 4519: anisotropic conductive film, 4520: partition, 680*a*: black region, 680*b*: white region, 9400: communication device, 9401: housing, 9402: operation button, 9403: external input terminal, 9404: microphone, 9405: speaker, 9406: light-emitting portion, 9410: display device, 9411:

housing, 9412: display portion, 9413: operation button, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: joint portion, 9900: slot machine, 9901: housing, 9903: display portion

The invention claimed is:

1. A manufacturing method of a semiconductor device comprising the steps of:
    forming a first conductive layer which functions as a gate electrode over a substrate;
    forming a first insulating layer to cover the first conductive layer;
    forming an oxide semiconductor layer over the first insulating layer so that the oxide semiconductor layer overlaps with the first conductive layer;
    forming a second conductive layer over the oxide semiconductor layer;
    forming a second insulating layer to cover the oxide semiconductor layer and the second conductive layer;
    forming a pixel electrode layer electrically connected to the second conductive layer;
    forming a third insulating layer over the second insulating layer and the pixel electrode layer;
    performing a first heat treatment after the step of forming the oxide semiconductor layer and before the step of forming the second insulating layer; and
    performing a second heat treatment after the step of forming the second insulating layer and before the step of forming the pixel electrode layer,
    wherein the oxide semiconductor layer includes a region where a hydrogen concentration is higher than a hydrogen concentration in the second insulating layer.

2. The manufacturing method of a semiconductor device according to claim 1, wherein the oxide semiconductor layer comprises at least one element selected from indium (In), gallium (Ga), zinc (Zn), iron (Fe), nickel (Ni), manganese (Mn), and cobalt (Co).

3. The manufacturing method of a semiconductor device according to claim 1,
    wherein a material of the oxide semiconductor layer is represented by $InMO_3(ZnO)_m$ (m>0), and
    wherein M denotes one or more of metal elements selected from gallium (Ga), iron (Fe), nickel (Ni), manganese (Mn), and cobalt (Co).

4. The manufacturing method of a semiconductor device according to claim 3, wherein M of $InMO_3(ZnO)_m$ denotes gallium (Ga).

5. The manufacturing method of a semiconductor device according to claim 1, wherein a nitrogen concentration in at least one of the first insulating layer and the second insulating layer is $1\times10^{19}$ atoms/cm$^3$ or lower.

6. The manufacturing method of a semiconductor device according to claim 1, wherein the oxide semiconductor layer and the second conductive layer are connected at least at a part of an upper surface of the oxide semiconductor layer.

7. The manufacturing method of a semiconductor device according to claim 1, wherein the oxide semiconductor layer and the second conductive layer are electrically connected to each other.

8. The manufacturing method of a semiconductor device according to claim 1, wherein the first heat treatment is performed after the step of forming the second conductive layer and before the step of forming the second insulating layer.

9. The manufacturing method of a semiconductor device according to claim 1, wherein a heat treatment temperature of the first heat treatment and a heat treatment temperature of the second heat treatment are 400° C. or lower.

10. The manufacturing method of a semiconductor device according to claim 1,
    wherein a hydrogen concentration in the oxide semiconductor layer is higher than a hydrogen concentration in the first insulating layer, and
    wherein a nitrogen concentration in the oxide semiconductor layer is higher than a nitrogen concentration in the first insulating layer.

11. The manufacturing method of a semiconductor device according to claim 1, wherein a nitrogen concentration in the first insulating layer is $1\times10^{19}$ atoms/cm$^3$ or lower.

12. The manufacturing method of a semiconductor device according to claim 1,
    wherein at least one of the first insulating layer and the second insulating layer comprises silicon oxide, silicon oxynitride, silicon nitride, silicon nitride oxide, aluminum oxide, or tantalum oxide.

13. The manufacturing method of a semiconductor device according to claim 1, wherein a hydrogen concentration in at least one of the first insulating layer and the second insulating layer is $1\times10^{21}$ atoms/cm$^3$ or lower.

14. A manufacturing method of a semiconductor device comprising the steps of:
    forming a first conductive layer which functions as a gate electrode over a substrate;
    forming a first insulating layer to cover the first conductive layer;
    forming a second conductive layer over the first insulating layer;
    forming an oxide semiconductor layer over the first insulating layer and the second conductive layer so that the oxide semiconductor layer overlaps with the first conductive layer;
    forming a second insulating layer to cover the oxide semiconductor layer and the second conductive layer;
    forming a pixel electrode layer electrically connected to the second conductive layer;
    forming a third insulating layer over the second insulating layer and the pixel electrode layer;
    performing a first heat treatment after the step of forming the oxide semiconductor layer and before the step of forming the second insulating layer; and
    performing a second heat treatment after the step of forming the second insulating layer and before the step of forming the pixel electrode layer,
    wherein the oxide semiconductor layer includes a region where a hydrogen concentration is higher than a hydrogen concentration in the second insulating layer.

15. The manufacturing method of a semiconductor device according to claim 14, wherein the oxide semiconductor layer comprises at least one element selected from indium (In), gallium (Ga), zinc (Zn), iron (Fe), nickel (Ni), manganese (Mn), and cobalt (Co).

16. The manufacturing method of a semiconductor device according to claim 14,
    wherein a material of the oxide semiconductor layer is represented by $InMO_3(ZnO)_m$ (m>0), and
    wherein M denotes one or more of metal elements selected from gallium (Ga), iron (Fe), nickel (Ni), manganese (Mn), and cobalt (Co).

17. The manufacturing method of a semiconductor device according to claim 16, wherein M of $InMO_3(ZnO)_m$ denotes gallium (Ga).

18. The manufacturing method of a semiconductor device according to claim 14,
wherein a hydrogen concentration in the oxide semiconductor layer is higher than a hydrogen concentration in the first insulating layer, and
wherein a nitrogen concentration in the oxide semiconductor layer is higher than a nitrogen concentration in the first insulating layer.

19. The manufacturing method of a semiconductor device according to claim 14, wherein a nitrogen concentration in the second insulating layer is $1\times10^{19}$ atoms/cm$^3$ or lower.

20. The manufacturing method of a semiconductor device according to claim 14, wherein a nitrogen concentration in at least one of the first insulating layer and the second insulating layer is $1\times10^{19}$ atoms/cm$^3$ or lower.

21. The manufacturing method of a semiconductor device according to claim 14, wherein the oxide semiconductor layer and the second conductive layer are connected at least at a part of a bottom surface of the oxide semiconductor layer.

22. The manufacturing method of a semiconductor device according to claim 14, wherein the oxide semiconductor layer and the second conductive layer are electrically connected to each other.

23. The manufacturing method of a semiconductor device according to claim 14, wherein a heat treatment temperature of the first heat treatment and a heat treatment temperature of the second heat treatment are 400° C. or lower.

24. The manufacturing method of a semiconductor device according to claim 14,
wherein at least one of the first insulating layer and the second insulating layer comprises silicon oxide, silicon oxynitride, silicon nitride, silicon nitride oxide, aluminum oxide, or tantalum oxide.

25. The manufacturing method of a semiconductor device according to claim 14, wherein a hydrogen concentration in at least one of the first insulating layer and the second insulating layer is $1\times10^{21}$ atoms/cm$^3$ or lower.

26. A manufacturing method of a semiconductor device comprising the steps of:
forming a first conductive layer which functions as a gate electrode over a substrate;
forming a first insulating layer to cover the first conductive layer;
forming an oxide semiconductor layer over the first insulating layer so that the oxide semiconductor layer overlaps with the first conductive layer;
forming a second conductive layer over the oxide semiconductor layer;
forming a second insulating layer to cover the oxide semiconductor layer and the second conductive layer;
forming a pixel electrode layer electrically connected to the second conductive layer;
forming a third insulating layer over the second insulating layer and the pixel electrode layer;
performing a first heat treatment after the step of forming the oxide semiconductor layer and before the step of forming the second insulating layer; and
performing a second heat treatment after the step of forming the second insulating layer and before the step of forming the pixel electrode layer,
wherein the second heat treatment is performed in an oxygen atmosphere, and
wherein defects in the second insulating layer are repaired by the second heat treatment.

\* \* \* \* \*